US012044717B2

(12) United States Patent
Kobayashi

(10) Patent No.: US 12,044,717 B2
(45) Date of Patent: Jul. 23, 2024

(54) ANALYSIS PROCESSING METHOD USING IMPEDANCE SPECTRUM DATA, IMPEDANCE SPECTRUM DATA ANALYSIS PROCESSING SYSTEM, AND IMPEDANCE SPECTRAL ANALYSIS PROCESSING PROGRAM

(71) Applicant: NATIONAL INSTITUTE FOR MATERIALS SCIENCE, Tsukuba (JP)

(72) Inventor: Kiyoshi Kobayashi, Tsukuba (JP)

(73) Assignee: National Institute for Materials Science, Tsukuba (JP)

( * ) Notice: Subject to any disclaimer, the term of this patent is extended or adjusted under 35 U.S.C. 154(b) by 694 days.

(21) Appl. No.: 17/260,383

(22) PCT Filed: Jul. 16, 2019

(86) PCT No.: PCT/JP2019/027936
§ 371 (c)(1),
(2) Date: Jan. 14, 2021

(87) PCT Pub. No.: WO2020/022124
PCT Pub. Date: Jan. 30, 2020

(65) Prior Publication Data
US 2021/0293867 A1 Sep. 23, 2021

(30) Foreign Application Priority Data

Jul. 23, 2018 (JP) ................................ 2018-137404

(51) Int. Cl.
*G01R 27/28* (2006.01)
*G01R 31/389* (2019.01)
(Continued)

(52) U.S. Cl.
CPC ........... *G01R 27/28* (2013.01); *G01R 31/389* (2019.01); *H01M 10/0422* (2013.01); *H01M 10/052* (2013.01); *H01M 10/4285* (2013.01)

(58) Field of Classification Search
CPC .... G01R 27/28; G01R 31/389; G01R 31/367; G01R 31/64; G01R 19/2509; G01R 23/02;
(Continued)

(56) References Cited

U.S. PATENT DOCUMENTS 5,486,762 A * 1/1996 Freedman ............ G01N 24/081
324/303
6,321,119 B1 * 11/2001 Kronberg ............... A61N 1/326
607/66

FOREIGN PATENT DOCUMENTS

CN 102544496 A * 7/2012 ........ H01M 10/0525
CN 104914312 A 9/2015
(Continued)

OTHER PUBLICATIONS

Extended European Search Report issued on Mar. 16, 2022 in European Paten Application 19841593.7.
(Continued)

*Primary Examiner* — Jeffrey P Aiello
(74) *Attorney, Agent, or Firm* — Morgan, Lewis & Bockius LLP

(57) ABSTRACT

This method for analysis processing by using measured impedance spectrum data includes: a step for determining whether to reset the maximum value and/or the minimum value of logarithmic relaxation time corresponding to a measured logarithmic frequency on the basis of the measured impedance spectrum data; a step for setting the number of equal-interval divisions within the range of the logarithmic relaxation time set in the determination step; and a step for analyzing parameters R∞, T, L, and Rl for the
(Continued)

range of the set logarithmic relaxation time so as to satisfy a prescribed expression (A) by applying a regularized least-squares method.

17 Claims, 20 Drawing Sheets

(51) Int. Cl.
*H01M 10/04* (2006.01)
*H01M 10/052* (2010.01)
*H01M 10/42* (2006.01)

(58) Field of Classification Search
CPC .............. G01R 25/00; H01M 10/0422; H01M 10/052; H01M 10/4285; H01M 10/48; H01M 8/04537; H01G 11/14; H01G 13/00; Y02E 60/50; Y02E 60/10; Y02P 70/50; H02J 7/00032; H02J 50/10; H02J 50/12; G01N 27/026; G01N 27/3274
USPC ...... 324/160, 430, 691; 702/63, 65, 69, 104, 702/66, 108, 188, 189, 75, 64, 76
See application file for complete search history.

(56) References Cited

FOREIGN PATENT DOCUMENTS

| JP | 3885356 B2 * | 2/2007 |
| WO | 2016/071801 A1 | 5/2016 |
| WO | 2018/131071 A1 | 7/2018 |

OTHER PUBLICATIONS

Braun et al., "Separation of the bulk and grain boundary contributions to the total conductivity of solid lithium-ion conducting electrolytes", J.Electroceram., 38, 157-167 (2017).

Sumi et al., "Development of Assistant Software for Estimating Equivalent Circuits by Distribution of Relaxation Times Method", Nov. 28, 2016, p. 195, (Lecture abstract of the 57th Battery Symposium in Japan).

Kobayashi et al., "Uncertainty of SOFC electrode reaction analysis by the DRT technique", Mar. 29, 2014, p. 106, (Lecture abstract of 81st conference of the Electrochemical Society of Japan).

International Search Report (with partial translation) and Written Opinion dated Sep. 10, 2019, issued in corresponding International Patent Application No. PCT/JP2019/027936.

* cited by examiner

FIG. 2
(A)
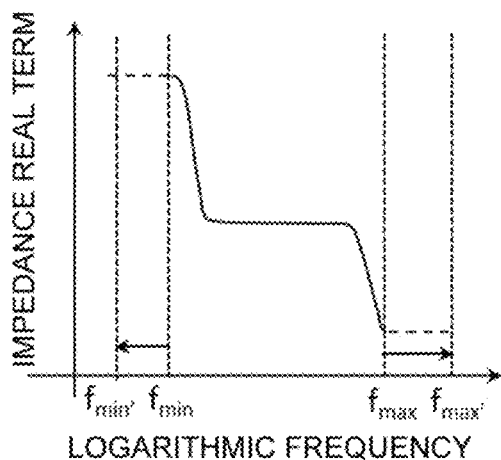
(B)
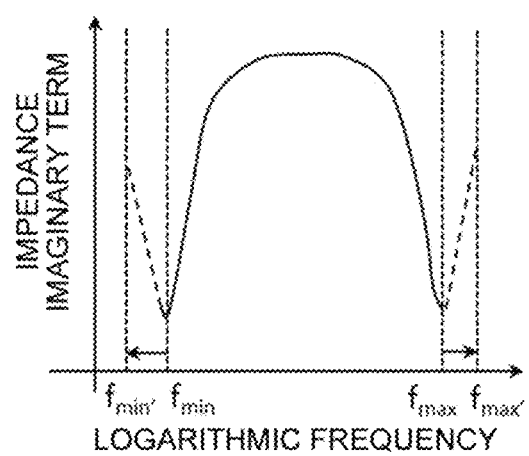
(C)
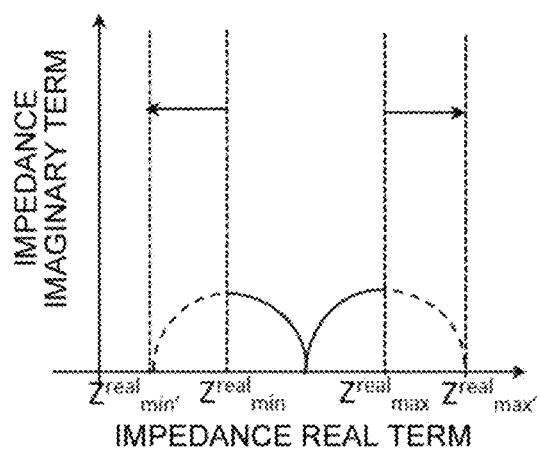

ANALYSIS PROCESSING METHOD USING IMPEDANCE SPECTRUM DATA, IMPEDANCE SPECTRUM DATA ANALYSIS PROCESSING SYSTEM, AND IMPEDANCE SPECTRAL ANALYSIS PROCESSING PROGRAM

TECHNICAL FIELD

The present invention relates to an analysis processing method using impedance spectrum data, an impedance spectrum data analysis processing system, and an impedance spectral analysis processing program.

BACKGROUND ART

As a method for analyzing measured impedance spectrum data, a method for obtaining a continuous relaxation time distribution is known (see, for example, Non Patent Literature 1). According to Non Patent Literature 1, when the frequency (f) taken at logarithmically equal intervals and the complex impedance (Z) are obtained as measurement data, the complex impedance is analyzed as being given by the following formulas (a) and (b). $R_\infty$ and $R_k$ in the formula (a) are undecided values and are parameters necessary for reproducing the measurement data.

[MATH. 1]

$$Z(f_p) \approx R_\infty + \sum_{k=1}^{N} \frac{R_k}{1 + 2\pi j \; \exp(\ln\tau_k)\exp(\ln f_p)} |\Delta \ln\tau| \quad (a)$$

$$\ln\tau_k = -\ln\left(\frac{f_k}{2\pi}\right) \quad (b)$$

Here, k is the sequence number of the logarithmic relaxation time, p is the sequence number of the measured data point, $f_k$ and $f_p$ are the k-th and p-th frequencies, j is a unit imaginary number, N is the number of measurement data points, $R_\infty$ is a high frequency limiting resistance, $\tau_k$ is the k-th relaxation time, $R_k$ is the resistance value at $\tau_k$, and $|\Delta \ln\tau|$ is the absolute value of the interval of the natural logarithmic relaxation time.

However, according to Non Patent Literature 1, for data in which, as exemplified by the impedance of a primary battery, a secondary battery, a capacitor, or a corrosive system, the absolute impedance value does not converge to a constant value due to a decrease in frequency, or the absolute impedance value hasn't converged to a constant value, the $R_k$ value set obtained by applying the formulas (a) and (b) may not be able to reproduce the measured impedance spectrum data. Moreover, since the above-mentioned sample contains an inductor component, the formulas (a) and (b) cannot be applied even when the impedance imaginary term takes a positive value.

CITATION LIST

Non Patent Literatures

NON PATENT LITERATURE 1: P. Braun et al, J. Electroceram., 38, 157-167 (2017)

SUMMARY OF INVENTION

Technical Problem

From the above, an object of the present invention is to provide an analysis processing method using measured impedance spectrum data, an impedance spectrum data analysis processing system, and an impedance spectrum data analysis processing program. A further object of the present invention is to provide an analysis processing method, an impedance spectrum data analysis processing system, and an impedance spectrum data analysis processing program that enable relaxation time distribution analysis on the measured impedance spectrum data.

Solution to Problem

A method of analysis processing using measured impedance spectrum data according to the present invention includes the steps of: determining whether to reset a maximum value and/or a minimum value of a logarithmic relaxation time corresponding to a measured logarithmic frequency based on the measured impedance spectrum data; resetting the maximum value and/or the minimum value of the logarithmic relaxation time when it is determined to reset in the determining; setting the number of divisions to be divided at equal intervals in a range of the logarithmic relaxation time corresponding to the measured logarithmic frequency when it is determined not to reset in the determining, or a range of the logarithmic relaxation time reset when it is determined to reset in the determining; and applying regularized least squares to analyze parameters $R_\infty$, T, L, and $R_l$ with respect to the range of the logarithmic relaxation time and the number of divisions set so as to satisfy the following formula (A)

[MATH. 2]

$$Z(f_p) \approx R_\infty + \frac{T}{2\pi f_p j} + 2\pi f_p L + \sum_{l=1}^{N} \frac{R_l}{1 + 2\pi j \; \exp(\ln\tau_l)\exp(\ln f_p)} |\Delta \ln\tau| \quad (A)$$

(p is a sequence number of a measured data point, 1 is a sequence number of the logarithmic relaxation time, $f_p$ is a p-th frequency, j is the unit imaginary number, M is the number of divisions of the logarithmic relaxation time, T is the reciprocal of a capacitance (C), L is an inductance, $R_\infty$ is a high frequency limiting resistance, $\tau_l$ is an l-th relaxation time, $R_l$ is a resistance value at $\tau_l$, and $|\Delta \ln\tau|$ is an absolute value of an interval of a natural logarithmic relaxation time). Thus, the above objects are achieved.

The determining determines to reset the maximum value and/or the minimum value of the logarithmic relaxation time used in the analyzing when, in the measured impedance spectrum data, (1) in a relationship between an impedance real term and the logarithmic frequency, the impedance real term has no plateau on a low frequency side and a high frequency side of a measured logarithmic frequency range, (2) in a relationship between an impedance imaginary term and the logarithmic frequency, the impedance imaginary term has no peak on the low frequency side and the high frequency side in the measured logarithmic frequency range, or (3) there is no arc in an impedance plot, and the resetting may (1') reset the maximum value and/or the minimum value of the logarithmic relaxation time used in the analyzing so that, in the relationship between the impedance real term and the logarithmic frequency, the impedance real term becomes a plateau on the low frequency side and the high frequency side beyond the measured logarithmic frequency range, (2') reset the maximum value and/or the minimum value of the logarithmic relaxation time used in the analyzing so that, in the relationship between the impedance imaginary term and the logarithmic frequency, the impedance imaginary term has a peak on the low frequency side and the high frequency side beyond the measured logarithmic frequency range, or (3') reset the maximum value and/or the minimum value of the logarithmic relaxation time used in the analyzing so that there is an arc in the impedance plot.

In relation to the measured logarithmic frequency range, the determining may include obtaining logarithmic relaxation time dependence of a natural logarithmic relaxation time distribution resistor $R_k$ using the following formula (a) and the following formula (b)

[MATH. 3]

$$Z(f_p) \approx R_\infty + \sum_{k=1}^{N} \frac{R_k}{1 + 2\pi j \exp(\ln \tau_k)\exp(\ln f_p)} |\Delta \ln \tau| \quad (a)$$

$$\ln \tau_k = -\ln\left(\frac{f_k}{2\pi}\right) \quad (b)$$

(k is a sequence number of the logarithmic relaxation time, p is a sequence number of the measured data point, $f_k$ and $f_p$ are k-th and p-th frequencies, j is the unit imaginary number, N is the number of measurement data points, $R_\infty$ to is a high frequency limiting resistance, $\tau_k$ is a k-th relaxation time, $R_k$ is a resistance value at $\tau_k$, and $|\Delta \ln \tau|$ is the absolute value of the interval of the natural logarithmic relaxation time), to thereby determine to reset the maximum value and/or the minimum value of the logarithmic relaxation time used in the analyzing when $R_k$ has no peak in the range of the logarithmic relaxation time corresponding to the measured logarithmic frequency, and the resetting may reset the maximum value and/or the minimum value of the logarithmic relaxation time used in the analyzing so that $R_k$ has a peak beyond the range of the logarithmic relaxation time corresponding to the measured logarithmic frequency.

In the analyzing, an impedance of the capacitor in the formula (A) may be given by the following formula (B)

$$Z(f)=T/(j2\pi f) \quad (B).$$

The analyzing may be calculated using regularized nonlinear optimization.

The regularized nonlinear optimization employed may be regularization selected from the group consisting of Tikhonov regularization, Lasso regularization, and Elastic Net regularization.

Alternatively, the regularized nonlinear optimization employed may be nonlinear optimization selected from the group consisting of a Levenberg-Marquardt method, a simplex method, and a conjugate gradient method.

The method may further include: substituting the parameters obtained in the analyzing into the formula (A) to obtain a theoretical impedance spectrum; and displaying and comparing the obtained theoretical impedance spectrum and the measured impedance spectrum, and determining whether or not the spectra match.

The method may further include repeating the resetting and subsequent steps when it is determined that the spectra do not match in the displaying, comparing, and determining whether or not the spectra match.

The measured impedance spectrum data may be impedance spectrum data of a sample selected from the group consisting of primary batteries, secondary batteries, fuel cells, capacitor materials, anticorrosion-treated metals, and ceramic materials.

In addition, an impedance spectrum data analysis processing system using measured impedance spectrum data according to the present invention includes: a control device; and a display device, wherein the control device includes a logarithmic relaxation time determination unit that determines whether to reset a maximum value and/or a minimum value of a logarithmic relaxation time corresponding to a measured logarithmic frequency based on the measured impedance spectrum data, a logarithmic relaxation time setting unit that resets the maximum value and/or the minimum value of the logarithmic relaxation time corresponding to the measured logarithmic frequency when the logarithmic relaxation time determination unit determines to reset, a division number setting unit that sets the number of divisions to be divided at equal intervals in a range of the logarithmic relaxation time corresponding to the measured logarithmic frequency when the logarithmic relaxation time determination unit determines not to reset, or a range of the logarithm relaxation time reset by the logarithmic relaxation time time setting unit when the logarithmic relaxation time determination unit determines to reset, and a parameter analysis unit that applies regularized least squares to analyze parameters $R_\infty$, T, L, and $R_l$ with respect to the range of the logarithmic relaxation time and the number of divisions set so as to satisfy the following formula (A)

[MATH. 4]

$$Z(f_p) \approx R_\infty + \frac{T}{2\pi f_p j} + 2\pi f_p L + \sum_{l=1}^{M} \frac{R_l}{1 + 2\pi j \exp(\ln \tau_l)\exp(\ln f_p)} |\Delta \ln \tau| \quad (A)$$

(p is a sequence number of a measured data point, l is a sequence number of the logarithmic relaxation time, $f_p$ is a p-th frequency, j is the unit imaginary number, M is the number of divisions of the logarithmic relaxation time, T is the reciprocal of a capacitance (C), L is an inductance, $\tau_l$ to is a high frequency limiting resistance, $\tau_l$ is an l-th relaxation time, $R_l$ is a resistance value at $\tau_l$, and $|\Delta \ln \tau|$ is an absolute value of an interval of a natural logarithmic relaxation time), and the display device displays an analysis result in the control device. Thus, the above objects are achieved.

The logarithmic relaxation time determination unit of the control device determines to reset the maximum value and/or the minimum value of the logarithmic relaxation time used in the parameter analysis unit when, in the measured impedance spectrum data, (1) in a relationship between an impedance real term and the logarithmic frequency, the impedance real term has no plateau on a low frequency side and a high frequency side of a measured logarithmic frequency range, (2) in a relationship between an impedance imaginary term and the logarithmic frequency, the impedance imaginary term has no peak on the low frequency side and the high frequency side in the measured logarithmic frequency range, or (3) there is no arc in an impedance plot, and the logarithmic relaxation time setting unit of the control device may (1') reset the maximum value and/or the minimum value of the logarithmic relaxation time used in the parameter analysis unit so that, in the relationship between the impedance real term and the logarithmic frequency, the impedance real term becomes a plateau on the low frequency side and the high frequency side beyond the measured logarithmic frequency range, (2') reset the maximum value and/or the minimum value of the logarithmic relaxation time used in the parameter analysis unit so that, in the relationship between the impedance imaginary term and the logarithmic frequency, the impedance imaginary term has a peak on the low frequency side and the high frequency side beyond the measured logarithmic frequency range, or (3') reset the maximum value and/or the minimum value of the logarithmic relaxation time used in the parameter analysis unit so that there is an arc in the impedance plot.

In relation to the measured logarithmic frequency range, the logarithmic relaxation time determination unit of the control device may include obtaining logarithmic relaxation time dependence of a natural logarithmic relaxation time distribution resistor $R_k$ using the following formula (a) and the following formula (b)

[MATH. 5]

$$Z(f_p) \approx R_\infty + \sum_{k=1}^{N} \frac{R_k}{1 + 2\pi j \exp(\ln \tau_k) \exp(\ln f_p)} |\Delta \ln \tau| \quad (a)$$

$$\ln \tau_k = -\ln\left(\frac{f_k}{2\pi}\right) \quad (b)$$

(k is a sequence number of the logarithmic relaxation time, p is a sequence number of the measured data point, $f_k$ and $f_p$ are k-th and p-th frequencies, j is the unit imaginary number, N is the number of measurement data points, $R_\infty$ is a high frequency limiting resistance, $\tau_k$ is a k-th relaxation time, $R_k$ is a resistance value at $\tau_k$, and $|\Delta \ln \tau|$ is the absolute value of the interval of the natural logarithmic relaxation time), to thereby determine to reset the maximum value and/or the minimum value of the logarithmic relaxation time used in the parameter analysis unit when $R_k$ has no peak in the range of the measured logarithmic frequency, and the logarithmic relaxation time setting unit of the control device may reset the maximum value and/or the minimum value of the logarithmic relaxation time used in the parameter analysis unit so that $R_k$ has a peak beyond the range of the logarithmic relaxation time corresponding to the measured logarithmic frequency.

The control device may include an input terminal with which an operator visually determines the (1) to (3) from the measured impedance spectrum data displayed on the display device, and manually resets the (1') to (3').

The control device may include an input terminal with which an operator visually determines whether or not the natural logarithmic relaxation time distribution resistor $R_k$ has a peak in the measured logarithmic frequency range from the logarithmic relaxation time dependence of $R_k$ displayed on the display device, and manually resets the maximum value and/or the minimum value of the logarithmic relaxation time used in the parameter analysis unit so that $R_k$ has a peak beyond the measured logarithmic frequency range.

In the formula (A), an impedance of the capacitor may be given by the following formula (B)

$$Z(f) = T/(j2\pi f) \quad (B).$$

The control device may further include a determination unit that substitutes the parameters obtained into the formula (A) to obtain a theoretical impedance spectrum, displays the obtained theoretical impedance spectrum and the measured impedance spectrum on the display device, compares them, and determines whether or not the theoretical impedance spectrum and the measured impedance spectrum match.

In addition, an impedance spectrum data analysis processing program according to the present invention causes a computer to execute the steps of: determining whether to reset a maximum value and/or a minimum value of a logarithmic relaxation time corresponding to a measured logarithmic frequency based on the measured impedance spectrum data; resetting the maximum value and/or the minimum value of the logarithmic relaxation time when it is determined to reset in the determining; setting the number to be divided at equal intervals in a range of the logarithmic relaxation time corresponding to the measured logarithmic frequency when it is determined not to reset in the determining, or a range of the logarithmic relaxation time reset when it is determined to reset in the determining; and applying regularized least squares to analyze parameters $R_\infty$, T, L, and $R_l$ with respect to the range of the logarithmic relaxation time and the number of divisions set so as to satisfy the following formula (A)

[MATH. 6]

$$Z(f_p) \approx R_\infty + \frac{T}{2\pi f_p j} + 2\pi f_p L + \sum_{l=1}^{M} \frac{R_l}{1 + 2\pi j \exp(\ln \tau_l) \exp(\ln f_p)} |\Delta \ln \tau| \quad (A)$$

(p is a sequence number of a measured data point, l is a sequence number of the logarithmic relaxation time, $f_p$ is a p-th frequency, j is the unit imaginary number, M is the number of divisions of the logarithmic relaxation time, T is the reciprocal of a capacitance (C), L is an inductance, $R_\infty$ is a high frequency limiting resistance, $\tau_l$ is an l-th relaxation time, $R_l$ is a resistance value at $\tau_l$, and $|\Delta \ln \tau|$ is an absolute value of an interval of a natural logarithmic relaxation time). Thus, the above objects are achieved.

The determining determines to reset the maximum value and/or the minimum value of the logarithmic relaxation time used in the analyzing when, in the measured impedance spectrum data, (1) in a relationship between an impedance real term and the logarithmic frequency, the impedance real term has no plateau on a low frequency side and a high frequency side of a measured logarithmic frequency range, (2) in a relationship between an impedance imaginary term and the logarithmic frequency, the impedance imaginary term has no peak on the low frequency side and the high frequency side in the measured logarithmic frequency range, or (3) there is no arc in an impedance plot, and the resetting may (1') reset the maximum value and/or the minimum value of the logarithmic relaxation time used in the analyzing so that, in the relationship between the impedance real term and the logarithmic frequency, the impedance real term becomes a plateau on the low frequency side and the high frequency side beyond the measured logarithmic frequency range, (2') reset the maximum value and/or the minimum value of the logarithmic relaxation time used in the analyzing so that, in the relationship between the impedance imaginary term and the logarithmic frequency, the impedance imaginary term has a peak on the low frequency side and the high frequency side beyond the measured logarithmic frequency range, or (3') reset the maximum value and/or the minimum value of the logarithmic relaxation time used in the analyzing so that there is an arc in the impedance plot.

In relation to the measured logarithmic frequency range, the determining may include obtaining logarithmic relaxation time dependence of a natural logarithmic relaxation time distribution resistor $R_k$ using the following formula (a) and the following formula (b)

[MATH. 7]

$$Z(f_p) \approx R_\infty + \sum_{k=1}^{N} \frac{R_k}{1 + 2\pi j \exp(\ln \tau_k) \exp(\ln f_p)} |\Delta \ln \tau| \quad (a)$$

$$\ln \tau_k = -\ln\left(\frac{f_k}{2\pi}\right) \quad (b)$$

(k is a sequence number of the logarithmic relaxation time, p is a sequence number of the measured data point, $f_k$ and $f_p$ are k-th and p-th frequencies, j is the unit imaginary number, N is the number of measurement data points, $R_\infty$ is a high frequency limiting resistance, $\tau_k$ is a k-th relaxation time, $R_k$ is a resistance value at $\tau_k$, and $|\Delta \ln\tau|$ is the absolute value of the interval of the natural logarithmic relaxation time), to thereby determine to reset the maximum value and/or the minimum value of the logarithmic relaxation time used in the analyzing when $R_k$ has no peak in the range of the measured logarithmic frequency, and the resetting may reset the maximum value and/or the minimum value of the logarithmic relaxation time used in the analyzing so that $R_k$ has a peak beyond the range of the logarithmic relaxation time corresponding to the measured logarithmic frequency.

The program may cause the computer to further execute the steps of: substituting the parameters obtained in the analyzing into the formula (A) to obtain a theoretical impedance spectrum; and displaying and comparing the obtained theoretical impedance spectrum and the measured impedance spectrum, and determining whether or not the spectra match.

Advantageous Effects of Invention

A method of analysis processing using measured impedance spectrum data of the present invention includes the steps of: determining whether to reset a maximum value and/or a minimum value of a logarithmic relaxation time used for calculation; setting the number to be divided at equal intervals in a range of the logarithmic relaxation time set; and applying regularized least squares to analyze parameters $R_\infty$, T, L, and $R_l$ with respect to the range of the logarithmic relaxation time so as to satisfy the above formula (A).

The present inventor has found that, by employing a new formula (A) in consideration of the capacitor component and the inductor component, it is possible to obtain various parameters that reproduce the measured impedance spectrum data even in the case of data in which, as exemplified by the impedance of a primary battery, a secondary battery, a corrosive system, or a capacitor, the absolute impedance value does not converge to a constant value due to a decrease in frequency, or the absolute impedance value hasn't converged to a constant value. By using the parameters obtained in this way, relaxation time distribution analysis can be performed on the impedance spectrum data described above. In addition, since the present invention determines whether to reset the maximum value and/or the minimum value of the logarithmic relaxation time used in calculation, and sets the number of equally divided intervals in the set logarithmic relaxation time range, it is possible to reproduce the measured impedance spectrum data with high accuracy when the parameters are obtained based on the above formula (A). By employing such an analysis processing method, it is possible to provide an analysis processing system and a program for executing it.

BRIEF DESCRIPTION OF DRAWINGS

FIG. 2 is a schematic diagram explaining a determination step.

DESCRIPTION OF EMBODIMENTS

Hereinafter, embodiments of the present invention are described with reference to the drawings. The same elements are given the same numerals, and the description thereof is omitted.

Figure 1:
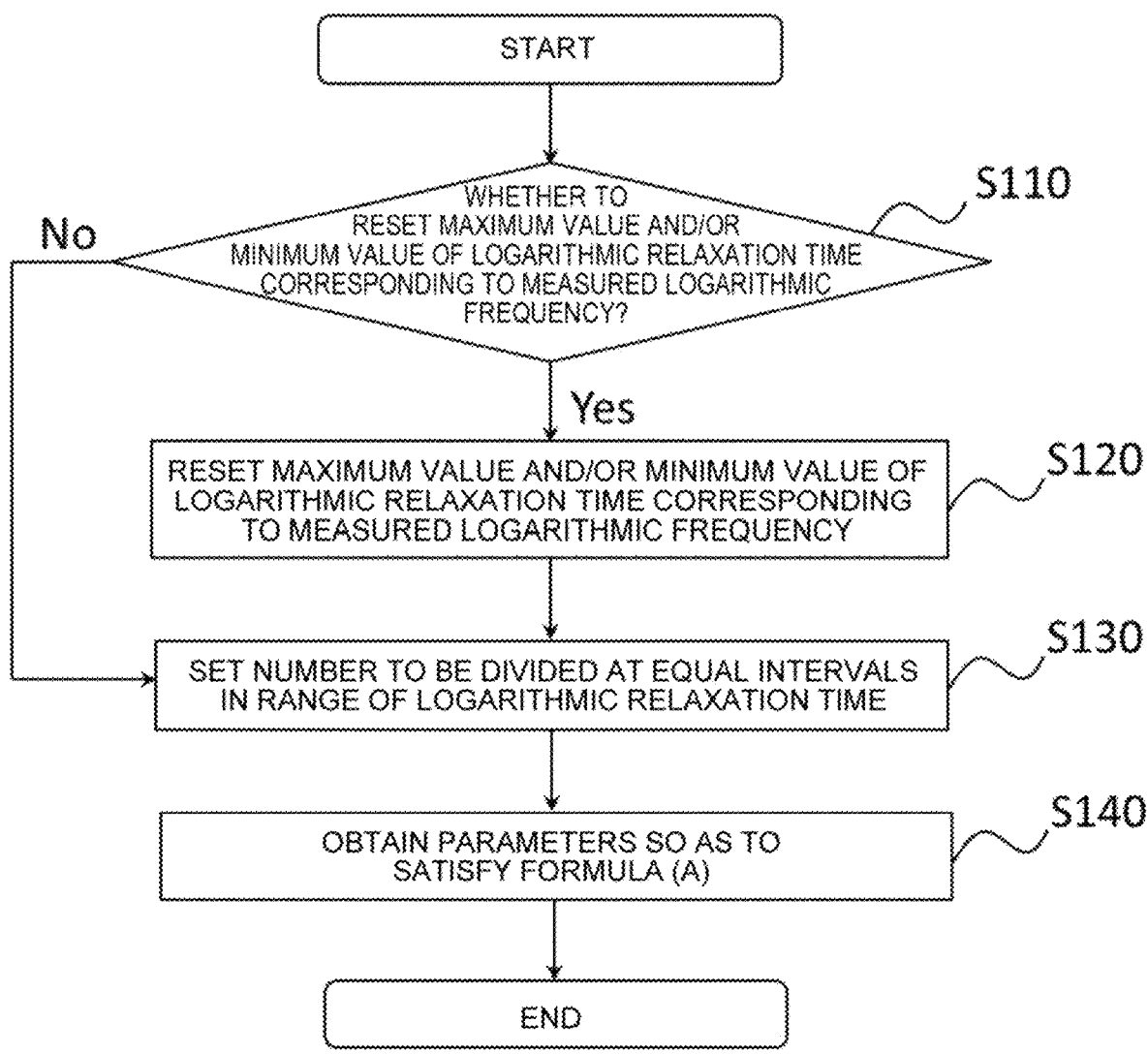
FIG. 1 is a flowchart showing a step of analysis processing of impedance spectrum data of the present invention.

FIG. 1 is a flowchart showing a step of analysis processing of impedance spectrum data of the present invention.

Step S110: determines whether to reset a maximum value and/or a minimum value of a logarithmic relaxation time corresponding to a measured logarithmic frequency based on the measured impedance spectrum data. It is possible to improve the accuracy of the analysis by reviewing the range of the logarithmic relaxation time used in the analysis described later. Note that the measured impedance spectrum data to be used may be external data measured by electrochemical measurement or may be data measured on the spot. When it is determined in step S110 that the setting is to be reset, the next step S120 is performed, but if it is determined that the setting is not to be reset, step S130 is performed.

Step S120: resets the maximum value and/or the minimum value of the logarithmic relaxation time corresponding to the measured logarithmic frequency.

Step S130: sets the number to be divided at equal intervals in a range of the logarithmic relaxation time reset in step S120, or a range of the logarithmic relaxation time corresponding to the measured logarithmic frequency when it is determined not to reset in step S110. This makes it possible to control the number of division points in the logarithmic relaxation time, so that the accuracy and speed of analysis can be improved. The number of divisions may be set by the operator (user) manually, or by a computer appropriately.

Step S140: applies regularized least squares to analyze parameters $R_\infty$, T, L, and $R_l$ with respect to the range of the logarithmic relaxation time set in step S120 and the number of divisions set in step S130 so as to satisfy the formula (A).

[MATH. 8]

$$Z(f_p) \approx R_\infty + \frac{T}{2\pi f_p j} + 2\pi f_p L + \sum_{l=1}^{M} \frac{R_l}{1 + 2\pi j \exp(\ln \tau_l) \exp(\ln f_p)} |\Delta \ln \tau| \quad (A)$$

Here, p is a sequence number of a measured data point, l is a sequence number of the logarithmic relaxation time, $f_p$ is a p-th frequency, j is the unit imaginary number, M is the number of divisions of the logarithmic relaxation time, T is a reciprocal of a capacitance (C), L is an inductance, $R_\infty$ is a high frequency limiting resistance, $\tau_l$ is an l-th relaxation time, $R_l$ is a resistance value at $\tau_l$, and $|\Delta \ln \tau|$ is an absolute value of an interval of a natural logarithm relaxation time.

The formula (A) is a formula newly devised by the inventor of the present application and takes into consideration the capacitor component and the inductor component, and therefore makes it possible to obtain various parameters that reproduce the measured impedance spectrum data even for data in which the absolute impedance value does not converge to a constant value due to a decrease in frequency, or the absolute impedance value hasn't converged to a constant value. Moreover, since the range of the logarithmic relaxation time used in the analysis of the formula (A) and the number of divisions thereof are reviewed in steps S120 and S130, various parameters can be obtained with high accuracy.

Here, the determination method in step S110 is described.

FIG. 2 is a schematic diagram explaining a determination step.

FIG. 2A is a diagram schematically showing the relationship between the impedance real term of the measured impedance spectrum data and the logarithmic frequency. FIG. 2B is a diagram schematically showing the relationship between the impedance imaginary term and the logarithmic frequency of the measured impedance spectrum data. FIG. 2C is a diagram schematically showing an impedance plot of the measured impedance spectrum data. In FIGS. 2A to 2C, it is assumed that the solid lines are the measured impedance spectrum data.

In FIG. 2A, (1) when the impedance real term is not a plateau (flat) on the low frequency side and the high frequency side in the measured logarithmic frequency range, it is determined that the maximum value and/or the minimum value of the logarithmic relaxation time corresponding to the measured logarithmic frequency is reset. When it is determined to reset, one may (1') reset the maximum value and/or the minimum value of the logarithmic relaxation time corresponding to the measured logarithmic frequency so that the impedance real term becomes a plateau on the low frequency side and the high frequency side beyond the measured logarithmic frequency range.

Note that, in the specification of the present application, "whether or not plateau (flat)" is intended that there is a flat region on the high frequency side and the low frequency side when the change in impedance real term with respect to the logarithmic frequency is visually observed, as in the examples described later, and it may be determined based on the change when the impedance real term is taken logarithmically is linear (plateau) or is not linear (not plateau) on the high frequency side and low frequency side. The determination using such a logarithm may be performed by the logarithmic relaxation time determination unit of the control device described later.

Referring to FIG. 2A, since the impedance real term does not indicate a plateau on either of the low frequency side ($f_{min}$) and the high frequency side ($f_{max}$), one may form a plateau on the low frequency side ($f_{min}'$) and the high frequency side ($f_{max}'$) beyond the measured logarithmic frequency range, and form the maximum value and the minimum value of the logarithmic relaxation time corresponding to these. Note that, in FIG. 2A, it is determined to reset both the low frequency side and the high frequency side of the measured logarithmic frequency, but if any of the impedance real terms is a plateau, only one of them may be reset.

In FIG. 2B, (2) when the impedance imaginary term does not have a downward peak on the low frequency side and the high frequency side in the measured logarithmic frequency range, it is determined that the maximum value and/or the minimum value of the logarithmic relaxation time corresponding to the measured logarithmic frequency is reset. When it is determined to reset, one may (2') reset the maximum value and/or the minimum value of the logarithmic relaxation time corresponding to the measured logarithmic frequency so that the impedance imaginary term has a downward peak on the low frequency side and the high frequency side beyond the measured logarithmic frequency range.

Referring to FIG. 2B, since the impedance imaginary term does not have a downward peak on either of the low frequency side ($f_{min}$) and the high frequency side ($f_{max}$), one may form a downward peak on the low frequency side ($f_{min}'$) and the high frequency side ($f_{max}'$) beyond the measured logarithmic frequency range, and form the maximum value and the minimum value of the logarithmic relaxation time corresponding to these. Note that, in FIG. 2B, it is determined to reset both the low frequency side and the high frequency side of the measured logarithmic frequency, but if any of the impedance imaginary terms has a downward peak, only one of them may be reset.

In FIG. 2C, (3) when there is no arc in the impedance plot, it is determined that the maximum value and/or the minimum value of the logarithmic relaxation time corresponding to the measured logarithmic frequency is reset. When it is determined to reset, for example, one may (3') change the impedance real term from $Z^{real}{}_{min}$ to $Z^{real}{}_{min'}$ and from $Z^{real}{}_{max}$ to $Z^{real}{}_{max'}$, so that the impedance plot has an arc, and form the maximum value and the minimum value of the logarithmic relaxation time corresponding to these. Note that, in FIG. 2C, it is determined to reset both the maximum value and the minimum value of the logarithmic relaxation time, but if any of the impedance plots is an arc, only one of them may be reset.

Figure 3:
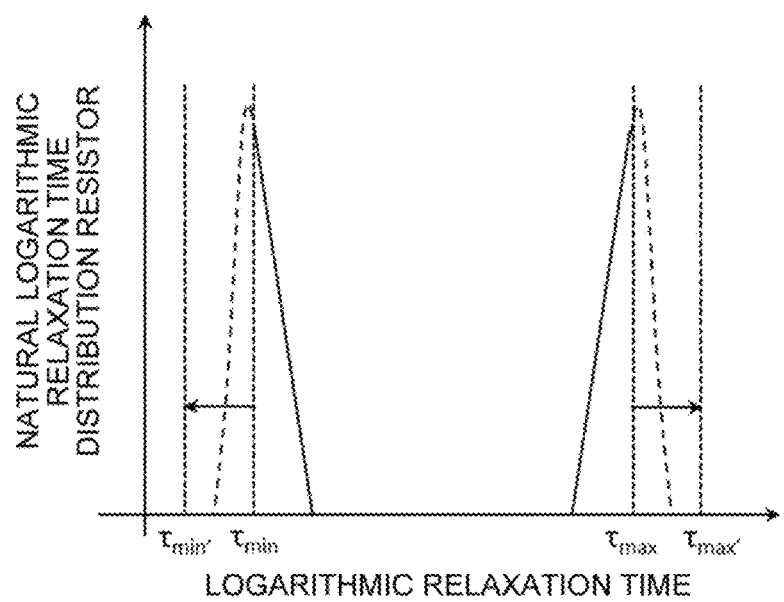
FIG. 3 is a schematic diagram explaining another determination step.

FIG. 3 is a schematic diagram explaining another determination step.

First, in relation to the measured logarithmic frequency range, the measured impedance spectrum data is used to obtain the logarithmic relaxation time dependence of the natural logarithmic relaxation time distribution resistor $R_k$ using the following formula (a) and the following formula (b).

[MATH. 9]

$$Z(f_p) \approx R_\infty + \sum_{k=1}^{N} \frac{R_k}{1 + 2\pi j \exp(\ln \tau_k) \exp(\ln f_p)} |\Delta \ln \tau| \quad (a)$$

$$\ln \tau_k = -\ln\left(\frac{f_k}{2\pi}\right) \quad (b)$$

Here, k is a sequence number of the logarithmic relaxation time, p is a sequence number of the measured data point, $f_k$ and $f_p$ are k-th and p-th frequencies, j is the unit imaginary number, N is the number of measurement data points, $R_\infty$ to is a high frequency limiting resistance, $\tau_k$ is a k-th relaxation time, $R_k$ is a resistance value at $\tau_k$, and $|\Delta \ln \tau|$ is the absolute value of the interval of the natural logarithmic relaxation time.

The formulas (a) and (b) are known formulas that are also applied in Non Patent Literature 1. In the logarithmic relaxation time distribution analysis obtained in this way, when there is no peak of $R_k$ in the range of the logarithmic relaxation time corresponding to the measured logarithmic frequency, it is determined that the maximum value and/or the minimum value of the logarithmic relaxation time corresponding to the measured logarithmic frequency is reset. When it is determined to reset, one may reset the maximum value and/or the minimum value of the logarithmic relaxation time corresponding to the measured logarithmic frequency as if $R_k$ had a peak beyond the range of the logarithmic relaxation time corresponding to the measured logarithmic frequency.

Referring to FIG. 3, since $R_k$ has no peaks at both ends of the logarithmic relaxation time ($\tau_{min}$ and $\tau_{max}$), one may set up as if $R_k$ is had peaks at both ends of the logarithmic relaxation time ($\tau_{min'}$ and $\tau_{max'}$) beyond the measured logarithmic frequency range, and form the maximum value and the minimum value of the logarithmic relaxation time corresponding to these. Note that, in FIG. 3, $R_k$ has no peaks at both ends of the logarithmic relaxation time, but if it has a peak on either side, only one of them may be reset. When reset in this way, the natural logarithmic relaxation time distribution resistor $R_l$ obtained from the formula (A) has a peak in the range of the logarithmic relaxation time set.

In addition, depending on the measured impedance spectrum data, there is a case where there is a peak only on one side depending on the sample. In this case, one may determine whether to reset the maximum value and/or the minimum value of the logarithmic relaxation time depending on whether or not the peak is in the range of the logarithmic relaxation time corresponding to the measured logarithmic frequency.

The determination as to whether to perform the resetting of step S110 described with reference to FIGS. 2 and 3 may be made visually and manually by the operator viewing the data displayed on the display or the like, or may be determined by the computer. When the computer determines to reset, it may extrapolate the displayed data, for example in FIG. 2A, reset the maximum value and/or the minimum value of the logarithmic relaxation time so that the plateau logarithmic frequency range of the impedance real term is $f_{max'}$ Hz or more and $f_{min'}$ Hz or less.

When it is not determined in step S110 that the setting is reset, the maximum value and the minimum value of the logarithmic relaxation time corresponding to the measured logarithmic frequency may be used for the analysis in step S140.

Return to FIG. 1 again.

In step S140, the impedance of the capacitor in the formula (A) may be given by the following formula (B).

$$Z(f)=T/(j2\pi f) \quad (B)$$

Conventionally, since regularized least squares includes a term that minimizes the parameter value, the impedance of the capacitance (C) is given by $Z(f)=1/(Cj2\pi f)$. However, the inventor of the present application has found that the calculation may diverge in the formula for capacitor impedance, but by employing the above formula (B) proposed by the inventor of the present application, it is possible to suppress the divergence of the calculation and apply regularized nonlinear optimization.

In step S140, the nonlinear optimization according to the formula (A) may result in a bad setting problem or a poor setting problem with too many parameters, and therefore may be optimized by using regularized nonlinear optimization. The regularized nonlinear optimization employed may be regularization selected from the group consisting of Tikhonov regularization, Lasso regularization, and Elastic Net regularization. Alternatively, regularized nonlinear optimization employed may be nonlinear optimization selected from the group consisting of a Levenberg-Marquardt method, a simplex method, and a conjugate gradient method. Of course, these regularization methods and nonlinear optimization methods may be combined.

In step S140, an appropriate positive value may be set in advance for the initial parameter value. In Examples described later, $R_\infty=1$, $T=10^{fmax'}$, $L=10^{fmax'+3}$, and $R_l=|Z_{imag}{}^{av}|/M.|Z_{imag}{}^{av}|$ is the absolute value of the average value of all measured impedance imaginary values. The set value of the initial value may be a positive value other than 0 and a value that can reproduce the measurement result by the calculation of regularized nonlinear optimization, and is not limited to the above-mentioned method of giving.

Steps S110 to S140 make it possible to obtain the parameters $R_\infty$, K, L, and $R_l$ with high accuracy. Note that, after performing step S140, the settings of step S120 and/or step S130 may be reviewed again, and step S140 may be repeated.

The present invention makes it possible to obtain various parameters that reproduce the measured impedance spectrum data even for data in which the absolute impedance value does not converge to a constant value due to a decrease in frequency, or the absolute impedance value hasn't converged to a constant value, and therefore it is possible to employ impedance spectrum data of a sample selected from the group consisting of primary batteries, secondary batteries, fuel cells, capacitor materials, anticorrosion-treated metals, and ceramic materials as the measured impedance spectrum data.

Figure 4:
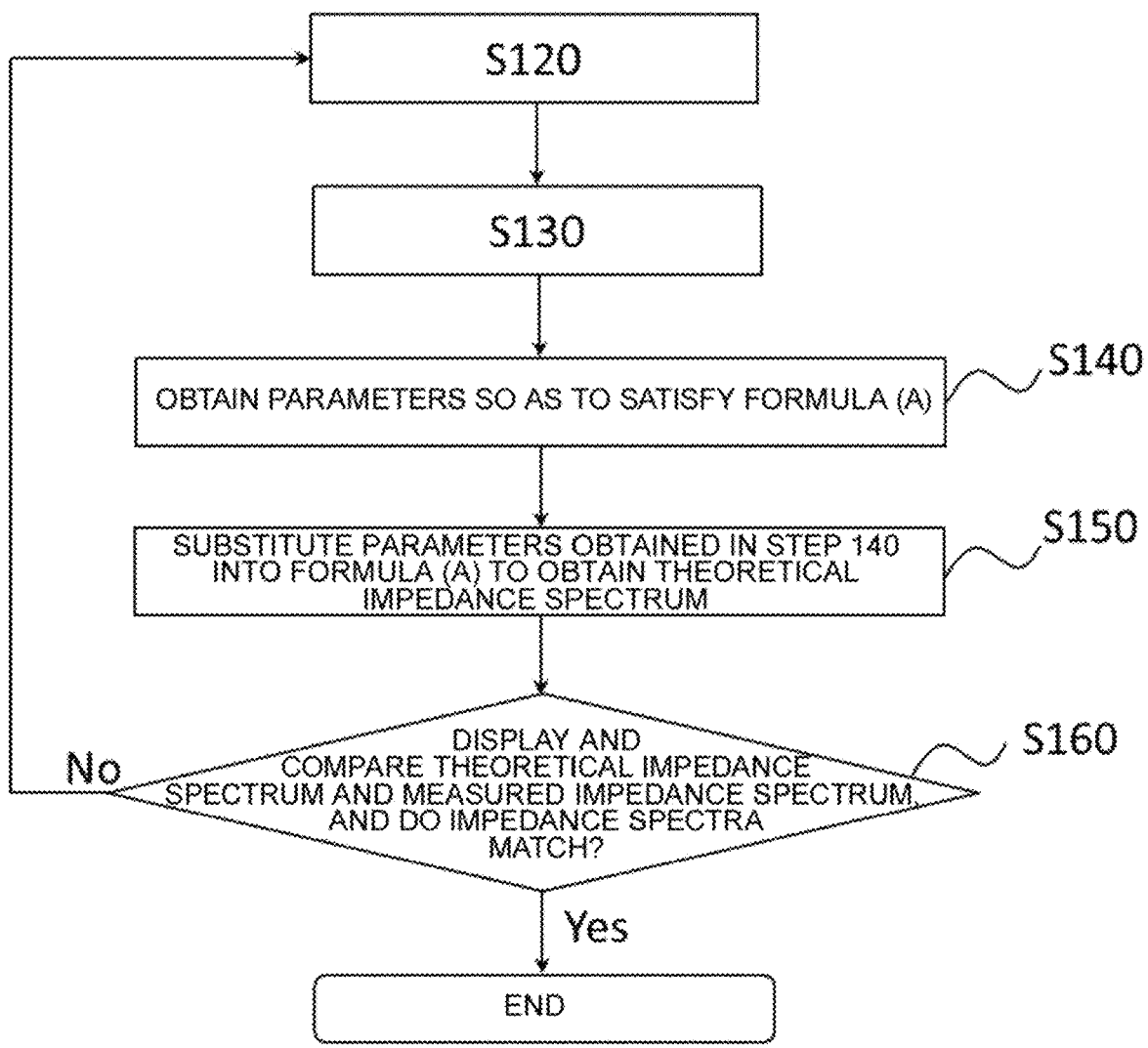
FIG. 4 is a flowchart showing a step of analysis processing of impedance spectrum data of the present invention following FIG. 1.

FIG. 4 is a flowchart showing a step of analysis processing of impedance spectrum data of the present invention following FIG. 1.

Step S140: following steps S120 and S130, determines the parameters so as to satisfy the formula (A).

Step S150: substitutes the parameters obtained in step S140 into the formula (A) to obtain theoretical impedance spectrum data.

Step S160: superimposes the theoretical impedance spectrum and the measured impedance spectrum and displays them for comparison.

The above procedure makes it possible to instantly visually determine the validity of the parameters obtained in step S140. Specifically, if the theoretical impedance spectrum data obtained in step S150 and the measured impedance spectrum data are in good agreement, it can be determined that the parameters obtained in step S140 are appropriate. Meanwhile, if the theoretical impedance spectrum data and the measured impedance spectrum data do not match, one may again set the maximum value and/or the minimum value of the logarithmic relaxation time and the number of divisions in step S120 and/or step S130, and repeat step S140, step S150, and step S160.

Next, an impedance spectrum data analysis system that performs the analysis processing method shown in FIG. 1 is described.

Figure 5:
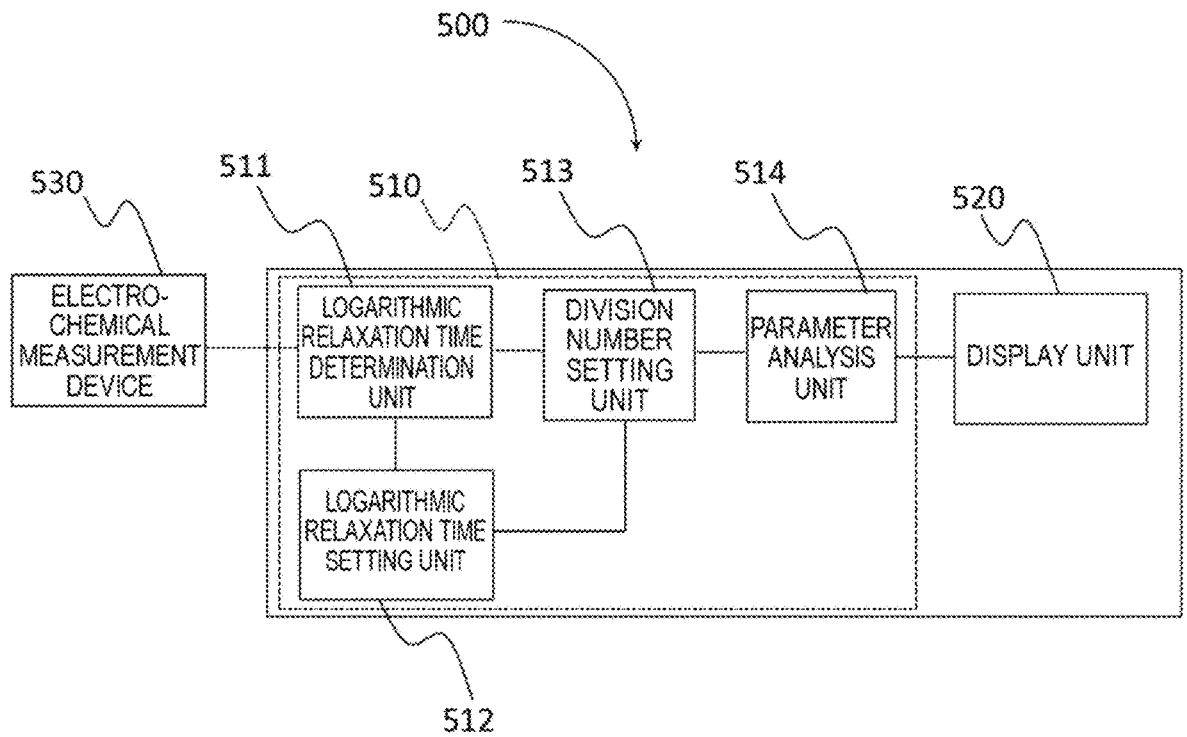
FIG. 5 is a block diagram showing an impedance spectrum data analysis processing system of the present invention.

FIG. 5 is a block diagram showing an impedance spectrum data analysis processing system of the present invention.

The impedance spectrum data analysis processing system (hereinafter simply referred to as an analysis processing system) 500 of the present invention includes at least a control device 510 and a display device 520.

In the logarithmic relaxation time determination unit 511, the control device 510 determines whether to reset the maximum value and/or the minimum value of the logarithmic relaxation time corresponding to the measured logarithmic frequency based on the measured impedance spectrum data. When it is determined to reset the logarithmic relaxation time, the logarithmic relaxation time setting unit 512 resets the maximum value and/or the minimum value of the logarithmic relaxation time. When it is determined not to reset, the division number setting unit 513 sets the number to be divided at equal intervals in the range of the logarithmic relaxation time corresponding to the measured logarithmic frequency, or the range of the logarithmic relaxation time reset in the logarithmic relaxation time setting unit 512 (steps S120 and S130 in FIG. 1). Here, the details of the determination of whether to reset the maximum value and/or the minimum value of the logarithmic relaxation time and the setting of the number to be divided at equal intervals in the range of the logarithmic relaxation time set are omitted because they are as described with reference to FIGS. 1 to 3.

Moreover, regularized least squares is applied in the parameter analysis unit 514 of the control device 510, and the parameters $R_\infty$, T, L, and $R_l$ are analyzed for the range of the logarithmic relaxation time set and the number of divisions set so as to satisfy the following formula (A) (step S140 in FIG. 1).

[MATH. 10]

$$Z(f_p) \approx R_\infty + \frac{T}{2\pi f_p j} + 2\pi f_p L + \sum_{l=1}^{M} \frac{R_l}{1 + 2\pi j \exp(\ln \tau_l) \exp(\ln f_p)} |\Delta \ln \tau| \quad (A)$$

Here, p is a sequence number of a measured data point, l is a sequence number of the logarithmic relaxation time, $f_p$ is a p-th frequency, j is the unit imaginary number, M is the number of divisions of the logarithmic relaxation time, T is a reciprocal of a capacitance (C), L is an inductance, $R_\infty$ is a high frequency limiting resistance, $\tau_l$ is an l-th relaxation time, $R_l$ is a resistance value at $\tau_l$, and $|\Delta \ln \tau|$ is an absolute value of an interval of a natural logarithmic relaxation time.

The display device 520 displays the analysis result in the parameter analysis unit 514. As the display device 520, any display device is employed as long as the analysis result can be displayed, but it is a display device or a projector device.

The control device 510 may further include an input terminal (not shown). As a result, the operator visually confirms the data displayed on the display device 520, determines whether to reset the maximum value and/or the minimum value of the logarithmic relaxation time corresponding to the measured logarithmic frequency, and sets the number to be divided at equal intervals in the range of the logarithmic relaxation time set.

The control device 510 substitutes the obtained parameters into the formula (A) again to obtain the theoretical impedance spectrum data, and displays the theoretical impedance spectrum data and the measured impedance spectrum data on the display device 520 and compares them.

The analysis processing system 500 may be connected to an electrochemical measurement device 530 that measures impedance spectrum data, or may be configured so that the control device 510 receives the measured impedance spectrum data.

Ina addition, the control device 510 is not limited as long as it exhibits the above-mentioned functions, but may preferably be a computer device including at least a memory, a central processing unit (CPU), a hard disk drive (HDD), a drive device, and a communication control unit. Specifically, the operating system (OS) and the application program (impedance spectrum data analysis processing program) for performing the analysis processing shown in FIG. 1 are stored in the HDD, executed by the CPU, and read from the HDD to the memory. The CPU controls the operation of the drive device, the communication control unit, or the display device 520 according to the content of the application program.

The communication control unit receives the measured impedance spectrum data and stores it in the memory, or stores the measured impedance spectrum data by the electrochemical measurement device 530 in the memory. Next, the CPU of the computer device performs the steps of executing the application program to read the measured impedance spectrum data and using the data as the basis to determine whether to reset the maximum value and/or the minimum value of the logarithmic relaxation time corresponding to the measured logarithmic frequency (step S110 in FIG. 1), setting the number to be divided at equal intervals in the range of the logarithmic relaxation time set in the determining (step S130 in FIG. 1), and applying regularized least squares to analyze the parameters $R_\infty$, T, L, and $R_l$ with respect to the range of the logarithmic relaxation time set and the number of divisions set so as to satisfy the following formula (A) (step S140 in FIG. 1).
[MATH. 11]

$$Z(f_p) \approx R_\infty + \frac{T}{2\pi f_p j} + 2\pi f_p L + \sum_{l=1}^{M} \frac{R_l}{1 + 2\pi j \exp(\ln \tau_l) \exp(\ln f_p)} |\Delta \ln \tau| \quad (A)$$

Here, p is a sequence number of a measured data point, l is a sequence number of the logarithmic relaxation time, $f_p$ is a p-th frequency, j is the unit imaginary number, M is the number of divisions of the logarithmic relaxation time, T is a reciprocal of a capacitance (C), L is an inductance, $R_\infty$ is a high frequency limiting resistance, $\tau_l$ is an l-th relaxation time, $R_l$ is a resistance value at $\tau_l$, and $|\Delta \ln \tau|$ is an absolute value of an interval of a natural logarithmic relaxation time.

Since the above steps S110 to S140 are as described above, duplicate explanation is avoided. The parameters obtained in the analyzing may be stored in memory.

Moreover, the CPU of the computer device may perform the steps of further executing the application program and substituting the parameters obtained in the analyzing into the formula (A) to obtain a theoretical impedance (S150 in FIG. 4), and displaying the obtained theoretical impedance spectrum and the measured impedance spectrum on a display device and comparing them (S160 in FIG. 4). Again, since steps S150 to S160 described above are as described above, duplicate explanation is avoided.

The above-mentioned application program (impedance spectrum data analysis processing program) has been described as being stored in the HDD, but may be stored and distributed on a computer-readable removable disk or the like, or may be distributed through a network line such as the Internet or a communication control unit and installed on a computer.

The present invention is described in detail next with reference to specific Examples, but it should be noted that the present invention is not limited to these Examples.

EXAMPLES

Comparative Example 1

Figure 6:
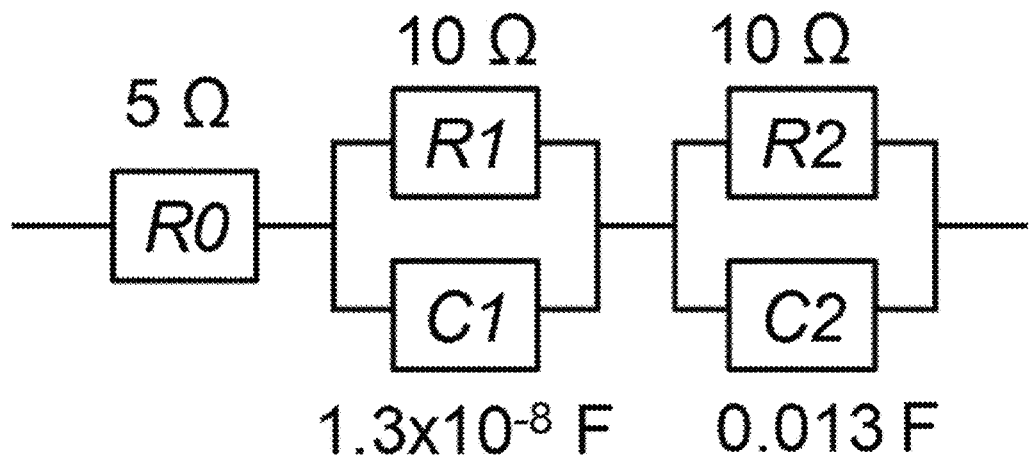
FIG. 6 is a diagram showing an electric circuit used in Comparative Example 1.

Comparative Example 1 used the above formulas (a) and (b) to investigate the logarithmic relaxation time dependence (relaxation time distribution analysis of the conventional method) of the natural logarithmic relaxation time distribution resistor $R_k$ based on the impedance spectrum data of 10 points per digit at equal intervals in logarithmic frequency at frequencies of 1 MHz to 1 Hz in the electric circuit shown in FIG. 6. Moreover, the theoretical impedance spectrum data was calculated from the obtained relaxation time distribution analysis, and compared with the measured impedance spectrum data. These results are shown in FIGS. 7 to 9.

FIG. 6 is a diagram showing an electric circuit used in Comparative Example 1. FIG. 7 is a list of impedance spectrum data calculated at a frequency of 1 MHz to 1 Hz using the electric circuit shown in FIG. 6.

Figure 7:
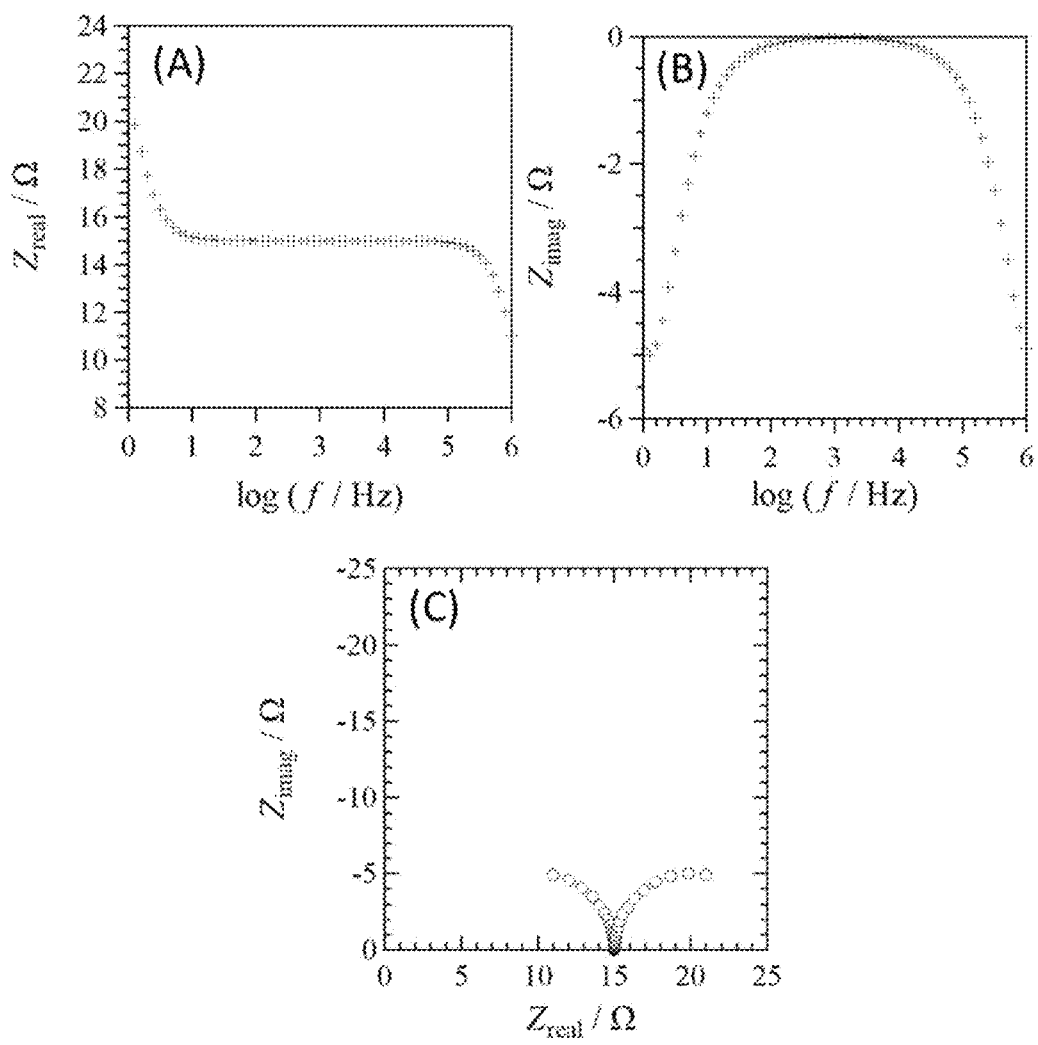
FIG. 7 is a list of impedance spectrum data calculated at a frequency of 1 MHz to 1 Hz using the electric circuit shown in FIG. 6.

FIG. 7A shows the relationship between the impedance real term and the logarithmic frequency, FIG. 7B shows the relationship between the impedance imaginary term and the logarithmic frequency, and FIG. 7C shows the impedance plot. According to (A) of FIG. 7, the impedance real term was not a plateau on the low frequency side and the high frequency side in the measured logarithmic frequency range. According to (B) of FIG. 7, the impedance imaginary term had no peak on the low frequency side and the high frequency side in the measured logarithmic frequency range. In FIG. 7 (C), the impedance plot had no arc.

Figure 8:
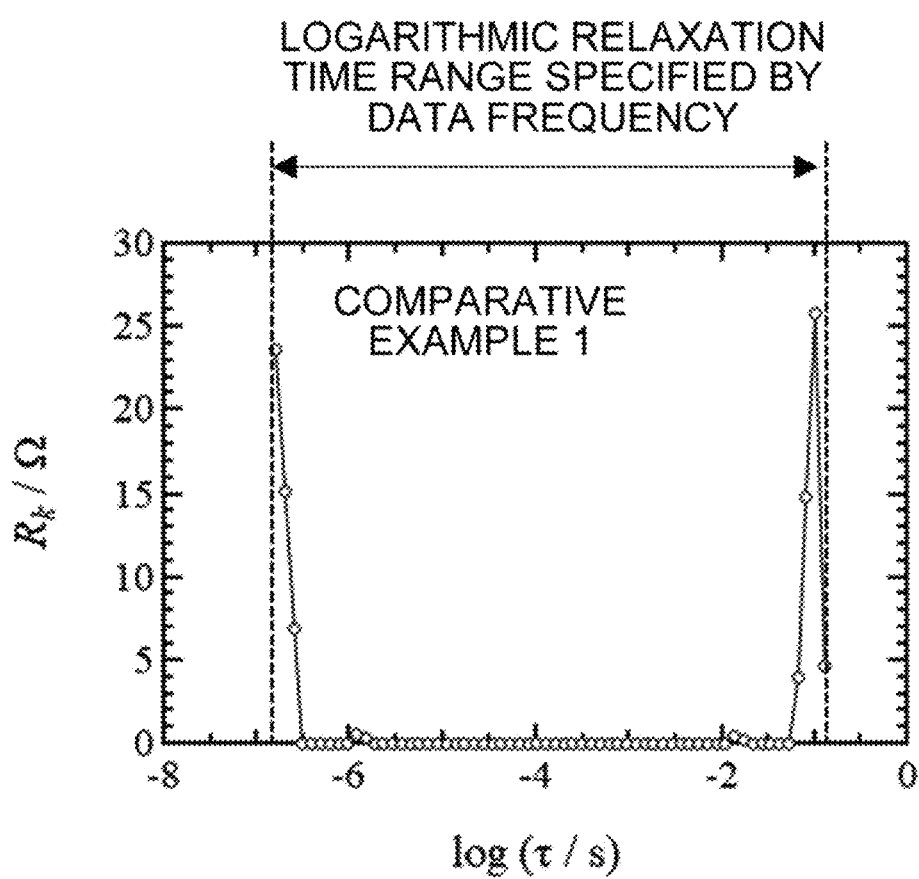
FIG. 8 is a diagram showing the logarithmic relaxation time dependence of the natural logarithmic relaxation time distribution resistor $R_k$ based on the impedance spectrum data of FIG. 7 according to Comparative Example 1.
Figure 9:
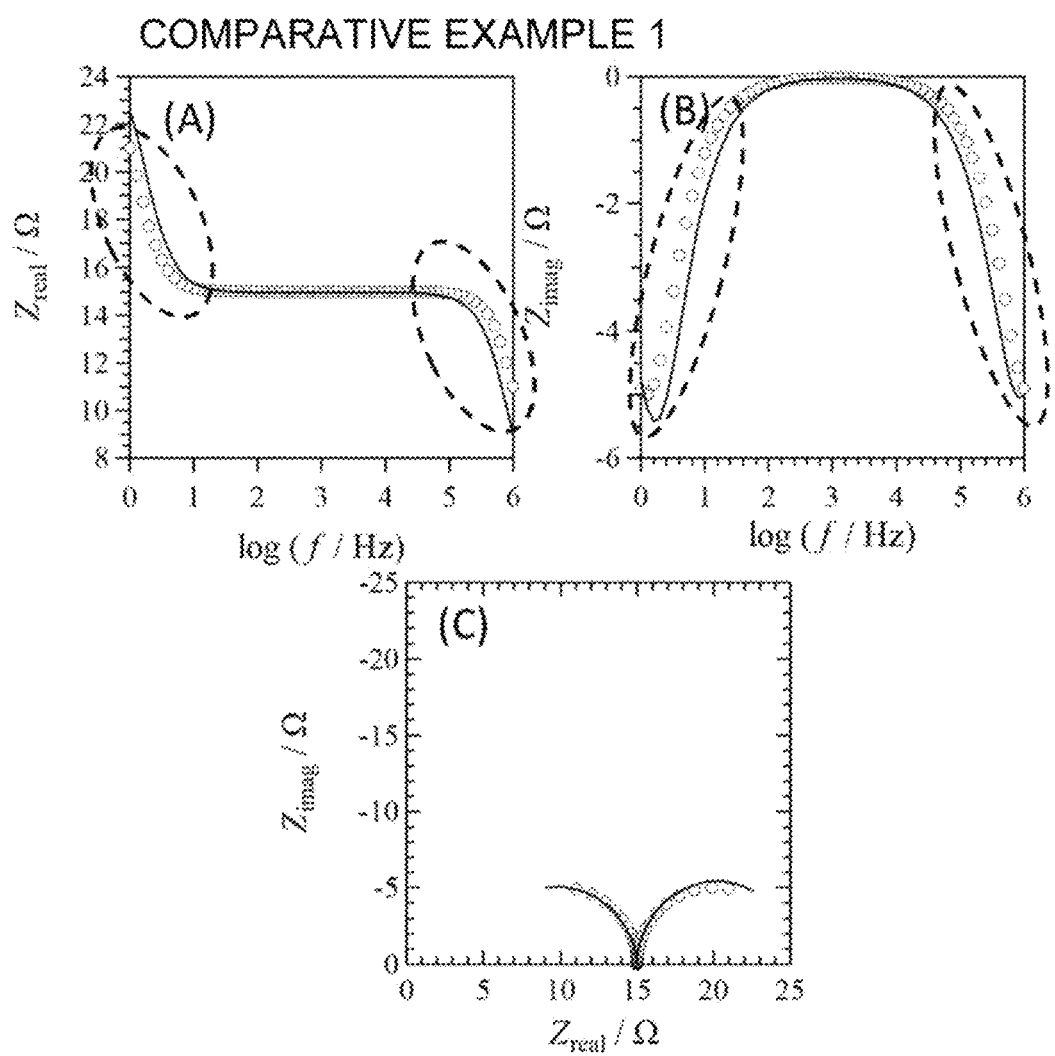
FIG. 9 is a diagram showing a comparison between the theoretical impedance spectrum data calculated from the relaxation time distribution analysis obtained in FIG. 8 according to Comparative Example 1 and the measured impedance spectrum data.

FIG. 8 is a diagram showing the logarithmic relaxation time dependence of the natural logarithmic relaxation time distribution resistor $R_k$ based on the impedance spectrum data of FIG. 7 according to Comparative Example 1.

According to FIG. 8, it was found that, in the relaxation time distribution analysis of the conventional method, there was no peak of $R_k$ in the range of the logarithmic relaxation time corresponding to the measured logarithmic frequency.

FIG. 9 is a diagram showing a comparison between the theoretical impedance spectrum data calculated from the relaxation time distribution analysis obtained in FIG. 8 according to Comparative Example 1 and the measured impedance spectrum data.

FIG. 9A shows the relationship between the impedance real term and the logarithmic frequency, FIG. 9B shows the relationship between the impedance imaginary term and the logarithmic frequency, and FIG. 9C shows the impedance plot, where white circles represent measured impedance spectrum data (that is, same as FIG. 7), and solid lines represent theoretical impedance spectrum data. According to FIG. 9, it was confirmed that the theoretical impedance spectrum data could not reproduce the measured impedance spectrum data, especially in the regions shown by the dotted lines.

Example 1

In Example 1, the analysis processing method shown in FIGS. 1 to 4 was carried out based on the impedance spectrum data (FIG. 7) measured by the same electric circuit as in Comparative Example 1. Specifically, FIGS. 7(A) to 7(C) and FIG. 8 were referred to, and it was determined whether to reset the maximum value and/or the minimum value of the logarithmic relaxation time corresponding to the measured logarithmic frequency (step S110 in FIG. 1). The determination was made visually.

The maximum value and minimum value of the logarithmic relaxation time were manually reset to $\log(1/(2\pi \times 10^{-2} [s]))$ and $\log(1/(2\pi \times 10^{9} [s]))$ so that the impedance real term would be a plateau on the low frequency side and the high frequency side beyond the measured logarithmic frequency range (1 Hz to 1 MHz) in FIG. 7A, so that the impedance imaginary term would have a peak on the low frequency side and the high frequency side beyond the measured logarithmic frequency range (1 Hz to 1 MHz) in FIG. 7B, so that the impedance plot would have an arc in FIG. 7C, and so that as if $R_k$ had a peak beyond the range of the logarithmic relaxation time in FIG. 8.

Figure 10:
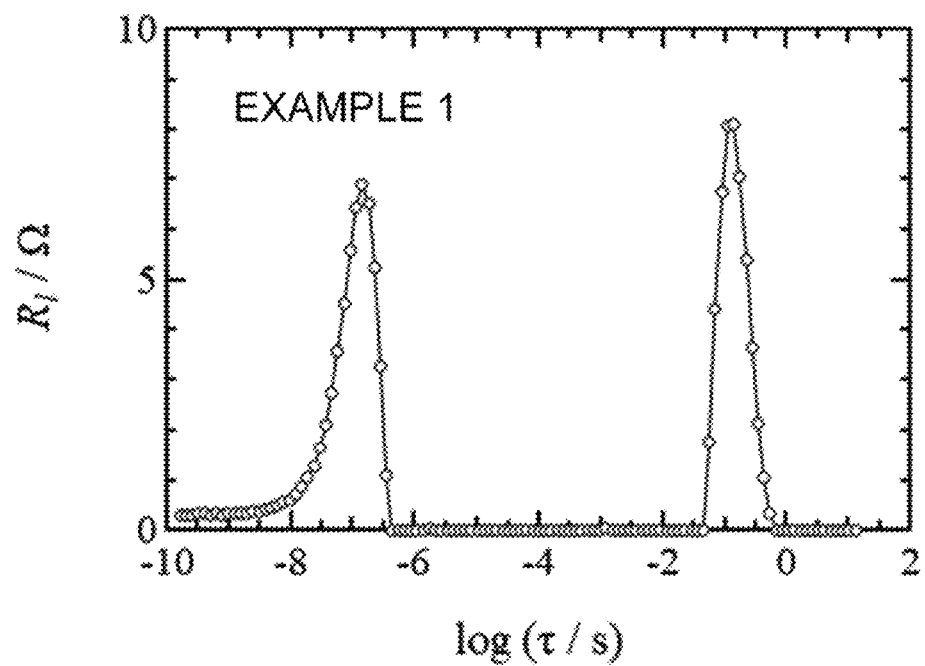
FIG. 10 is a diagram showing the logarithmic relaxation time dependence of the natural logarithmic relaxation time distribution resistor $R_l$ for which the range of the logarithmic relaxation time is reset based on the impedance spectrum data of FIG. 7 according to Example 1.

The number to be divided at equal intervals in the range of the logarithmic relaxation time set was manually set to 10 points per digit of the relaxation time on a logarithmic scale (step S130 in FIG. 1). Next, regularized least squares was applied to analyze parameters $R_\infty$, T, L, and $R_l$ with respect to the range of the logarithmic relaxation time set and the number of divisions set so as to satisfy the formula (A) (step S140 in FIG. 1). This analysis was further performed by a computer device using the formula (B) and Tikhonov's regularized nonlinear optimization. Note that the initial values of the parameters used were $R_\infty=1$, $T=10^{fmax'}$, $L=10^{fmax'+3}$ and $R_k=Z_{imag}^{av}/M$. Here, $Z_{imag}^{av}$ was the average value (1.7Ω) of all measured impedance imaginary values, $f_{max'}$ was $10^6$ Hz, and M was 91. The results are shown in FIG. 10. Moreover, the theoretical impedance spectrum data was calculated from the relaxation time distribution analysis and compared with the measured impedance spectrum data. The results are shown in FIG. 11.

FIG. 10 is a diagram showing the logarithmic relaxation time dependence of the natural logarithmic relaxation time distribution resistor $R_l$ for which the range of the logarithmic relaxation time is reset based on the impedance spectrum data of FIG. 7 according to Example 1.

According to FIG. 10, in the relaxation time distribution analysis where the range of the logarithmic relaxation time was reset and the formula (A) devised by the present inventor was used, it was found that there was a peak of $R_l$ in the range of the logarithmic relaxation time set.

Figure 11:
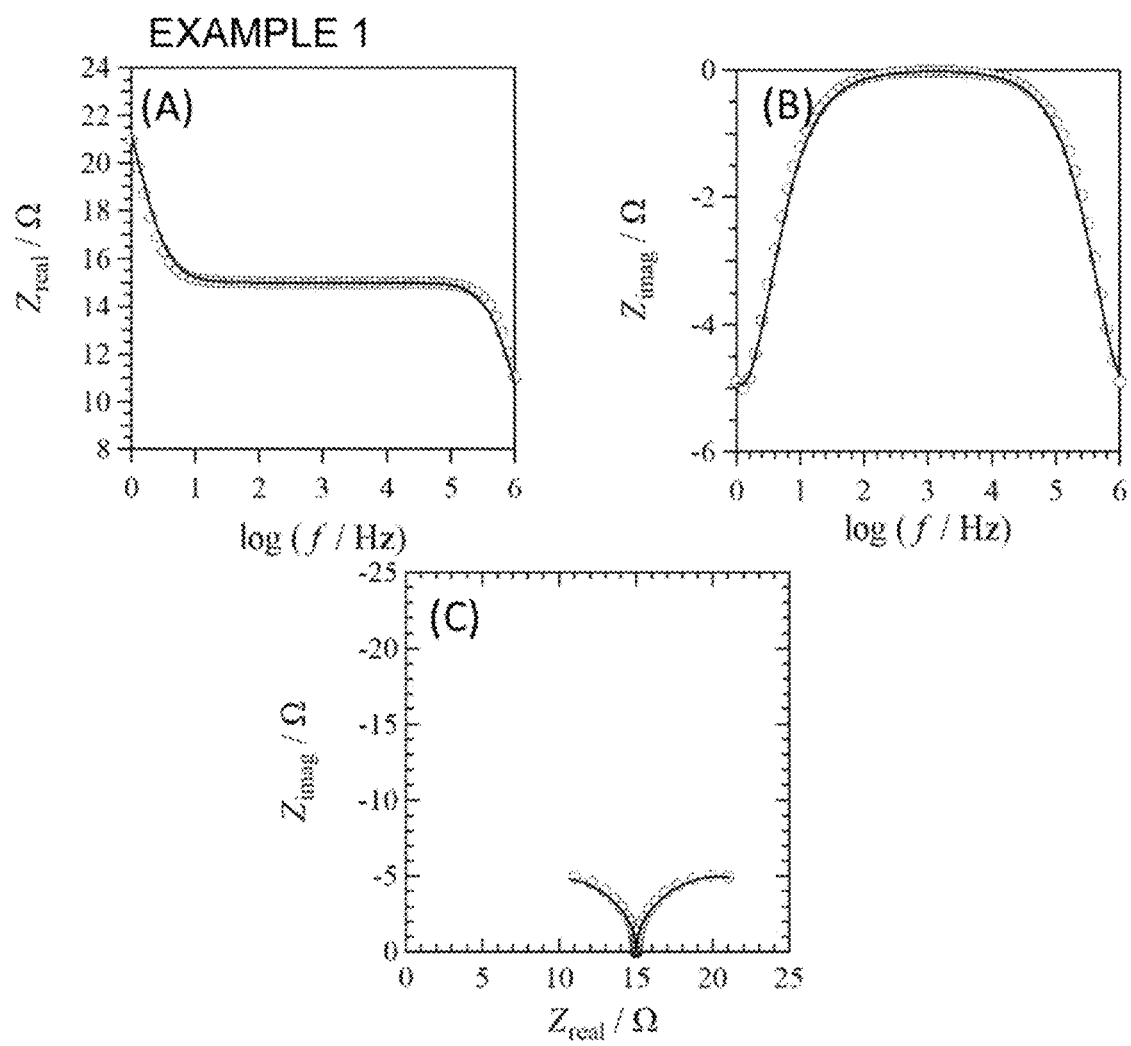
FIG. 11 is a diagram showing a comparison between the theoretical impedance spectrum data calculated from the relaxation time distribution analysis obtained in FIG. 10 according to Example 1 and the measured impedance spectrum data.

FIG. 11 is a diagram showing a comparison between the theoretical impedance spectrum data calculated from the relaxation time distribution analysis obtained in FIG. 10 according to Example 1 and the measured impedance spectrum data.

FIG. 11A shows the relationship between the impedance real term and the logarithmic frequency, FIG. 11B shows the relationship between the impedance imaginary term and the logarithmic frequency, and FIG. 11C shows the impedance plot, where white circles represent measured impedance spectrum data (that is, same as FIG. 7), and solid lines represent theoretical impedance spectrum data. According to FIG. 11, it was visually confirmed that the theoretical impedance spectrum data could completely reproduce the measured impedance spectrum data, and the obtained parameters were appropriate.

Comparative Example 2

Comparative Example 2 used the above formulas (a) and (b) to investigate the logarithmic relaxation time dependence (relaxation time distribution analysis of the conventional method) of the natural logarithmic relaxation time distribution resistor $R_k$ based on the measured impedance spectrum data of a commercially available coin-type lithium battery (CR1620). The impedance spectrum of a commercially available coin-type lithium battery (CR1620) was measured using an electrochemical measurement device (a device connected with a 1296-inch potentiostat/galvanostat manufactured by Solartron and a 1255-inch frequency response characteristic device manufactured by the same company). Furthermore, the theoretical impedance spectrum data was calculated from the obtained relaxation time distribution analysis and compared with the measured impedance spectrum data. These results are shown in FIGS. 12 to 14.

Figure 12:
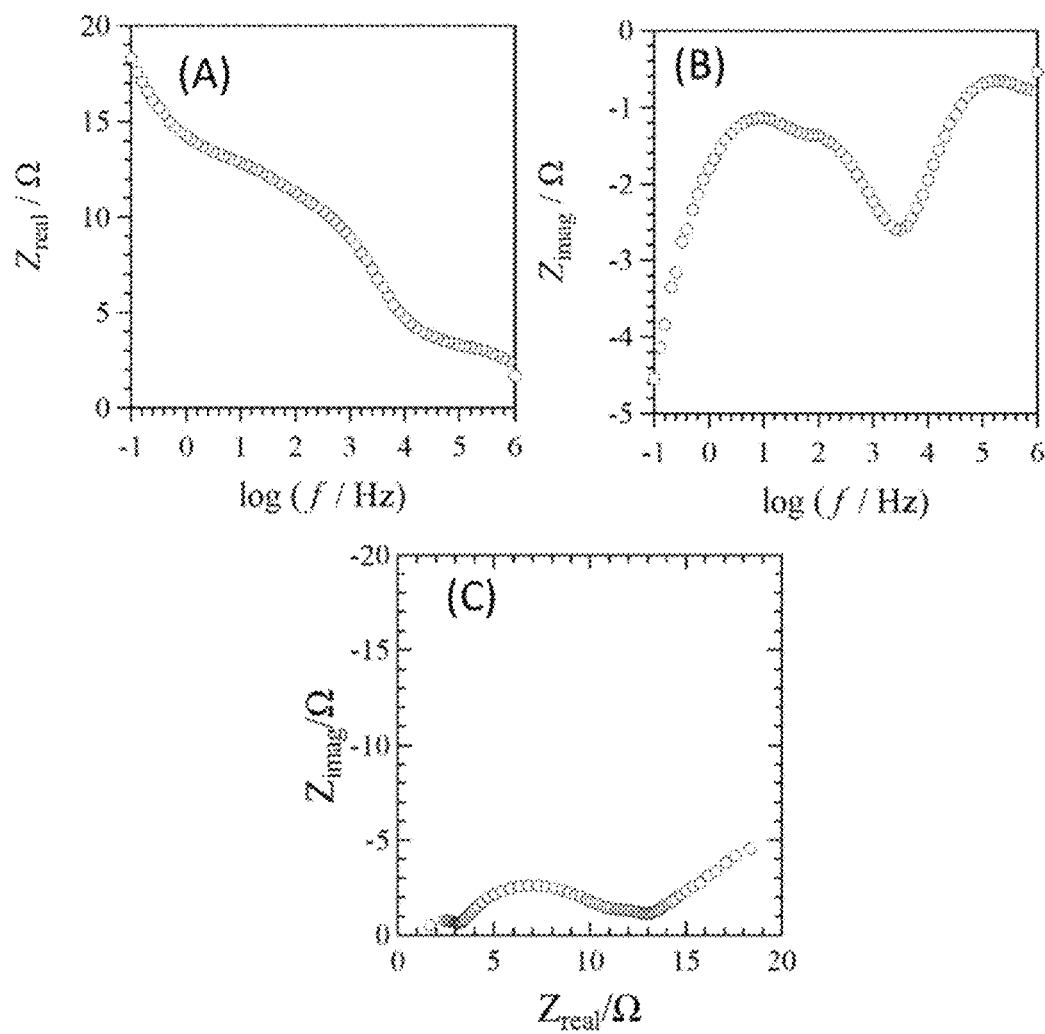
FIG. 12 is a diagram showing impedance spectrum data of the coin-type lithium battery of Comparative Example 2.

FIG. 12 is a diagram showing impedance spectrum data of the coin-type lithium battery of Comparative Example 2.

FIG. 12A shows the relationship between the impedance real term and the logarithmic frequency, FIG. 12B shows the relationship between the impedance imaginary term and the logarithmic frequency, and FIG. 12C shows the impedance plot, where even though the frequency became smaller, both the impedance real term and the impedance imaginary term became a spectrum not converging to a constant value. This is because, in a coin-type lithium battery, the characteristic impedance associated with substance diffusion appears in the low frequency range.

Figure 13:
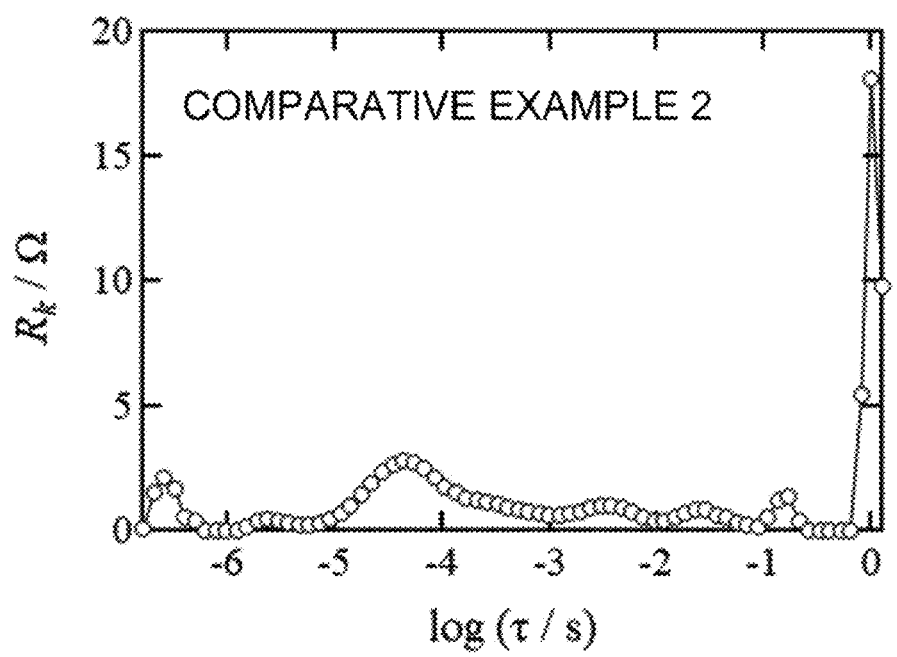
FIG. 13 is a diagram showing the logarithmic relaxation time dependence of the natural logarithmic relaxation time distribution resistor $R_k$ based on the impedance spectrum data of FIG. 12 according to Comparative Example 2.
Figure 14:
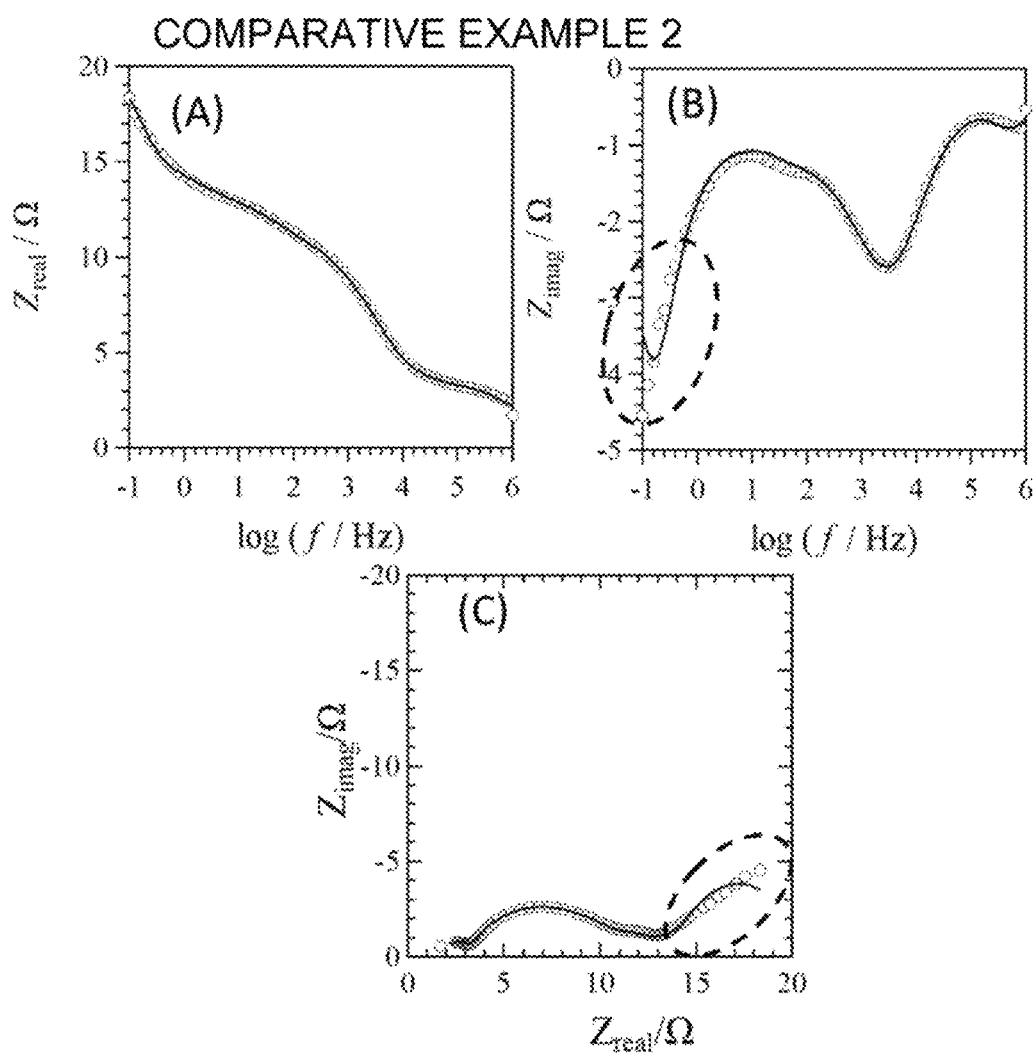
FIG. 14 is a diagram showing a comparison between the theoretical impedance spectrum data calculated from the relaxation time distribution analysis obtained in FIG. 13 according to Comparative Example 2 and the measured impedance spectrum data.

FIG. 13 is a diagram showing the logarithmic relaxation time dependence of the natural logarithmic relaxation time distribution resistor $R_k$ based on the impedance spectrum data of FIG. 12 according to Comparative Example 2.

According to FIG. 13, in the relaxation time distribution analysis of the conventional method, it was found that the peak of $R_k$ was not included in the range of the logarithmic relaxation time corresponding to the measured logarithmic frequency.

FIG. 14 is a diagram showing a comparison between the theoretical impedance spectrum data calculated from the relaxation time distribution analysis obtained in FIG. 13 according to Comparative Example 2 and the measured impedance spectrum data.

FIG. 14A shows the relationship between the impedance real term and the logarithmic frequency, FIG. 14B shows the relationship between the impedance imaginary term and the logarithmic frequency, and FIG. 14C shows the impedance plot, where white circles represent measured impedance spectrum data (that is, same as FIG. 12), and solid lines represent theoretical impedance spectrum data. According to FIG. 14, it was confirmed that the theoretical impedance spectrum data could not reproduce the measured impedance spectrum data especially in the regions shown by the dotted lines (logarithmic frequency log f is about −1).

Example 2

In Example 2, the analysis processing method shown in FIGS. 1 to 4 was carried out based on the impedance spectrum data (FIG. 12) measured by the same coin-type lithium battery as in Comparative Example 2. Specifically, FIG. 13 was referred to, and it was determined whether to reset the maximum value and/or the minimum value of the logarithmic relaxation time corresponding to the measured logarithmic frequency (step S110 in FIG. 1).

The maximum value and minimum value of the logarithmic relaxation time were manually reset to $\log(1/(2\pi\times10^{-3} [s]))$ and $\log(1/(2\pi\times10^6 [s]))$ so that as if $R_k$ had a peak beyond the range of the logarithmic relaxation time in FIG. 13.

Figure 15:
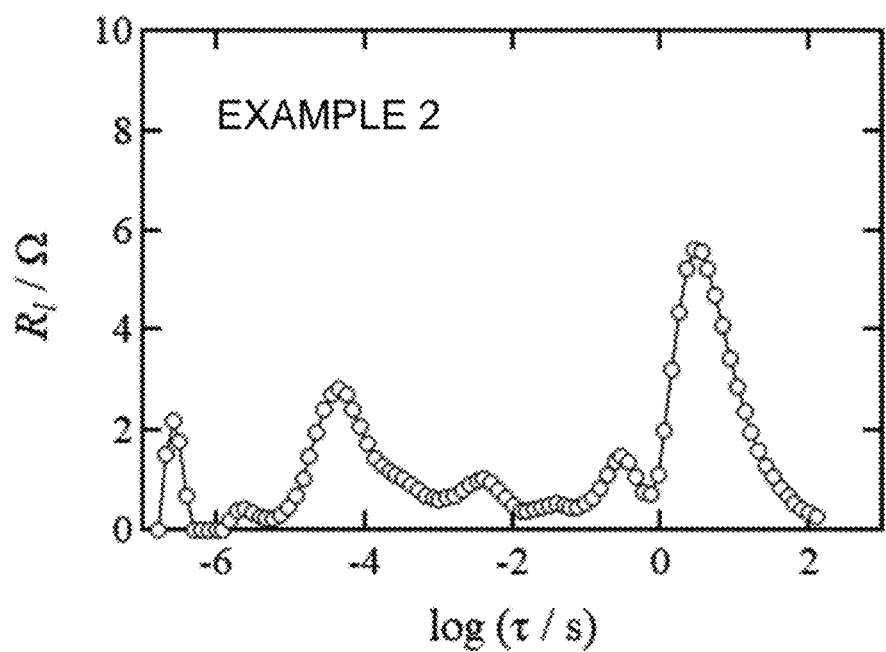
FIG. 15 is a diagram showing the logarithmic relaxation time dependence of the natural logarithmic relaxation time distribution resistor $R_l$ for which the range of the logarithmic relaxation time is reset based on the impedance spectrum data of FIG. 12 according to Example 2.

The number to be divided at equal intervals in the range of the logarithmic relaxation time set was manually set to 10 points per digit of the relaxation time on a logarithmic scale (step S130 in FIG. 1). Next, regularized least squares was applied to analyze parameters $R_\infty$, T, L, and $R_l$ with respect to the range of the logarithmic relaxation time set and the number of divisions set so as to satisfy the formula (A) (step S140 in FIG. 1). Note that the initial values of the parameters used were $R_\infty=1$, $T=10^{fmax'}$ $L=10^{fmax'+3}$ and $R_k=1Z_{imag}^{av}/M$. Here, $|Z_{imag}^{av}|$ was the absolute value of the average value (1.7Ω) of all measured impedance imaginary values, $f_{max'}$ was $10^6$ Hz, and M was 91. This analysis was performed by a computer device using the formula (B) and Tikhonov's regularized nonlinear optimization. The results are shown in FIG. 15. Moreover, the theoretical impedance spectrum data was calculated from the relaxation time distribution analysis and compared with the measured impedance spectrum data. The results are shown in FIG. 16.

FIG. 15 is a diagram showing the logarithmic relaxation time dependence of the natural logarithmic relaxation time distribution resistor $R_l$ for which the range of the logarithmic relaxation time is reset based on the impedance spectrum data of FIG. 12 according to Example 2.

According to FIG. 15, in the relaxation time distribution analysis where the range of the logarithmic relaxation time was reset and the formula (A) devised by the present inventor was used, it was found that there was a peak of $R_l$ in the range of the logarithmic relaxation time set.

Figure 16:
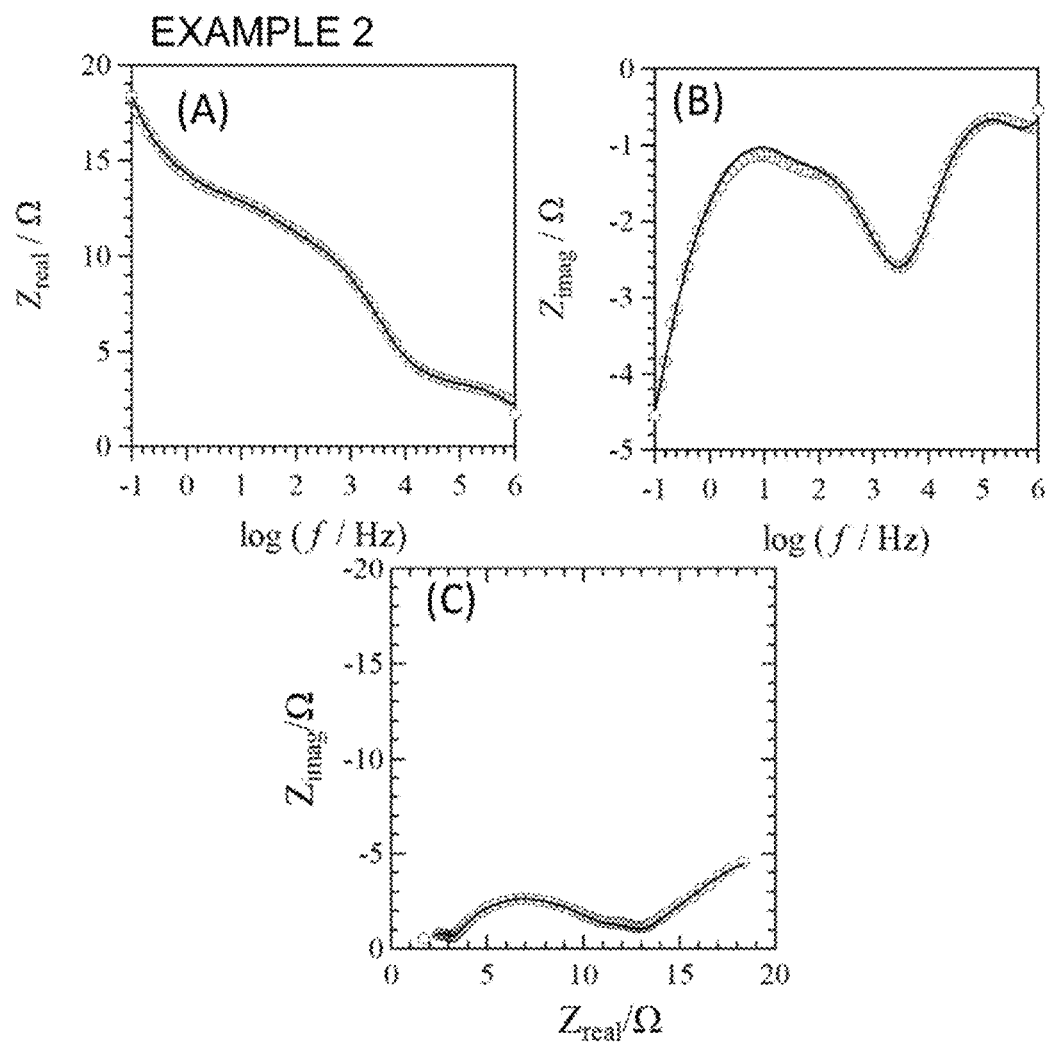
FIG. 16 is a diagram showing a comparison between the theoretical impedance spectrum data calculated from the relaxation time distribution analysis obtained in FIG. 15 according to Example 2 and the measured impedance spectrum data.

FIG. 16 is a diagram showing a comparison between the theoretical impedance spectrum data calculated from the relaxation time distribution analysis obtained in FIG. 15 according to Example 2 and the measured impedance spectrum data.

FIG. 16A shows the relationship between the impedance real term and the logarithmic frequency, FIG. 16B shows the relationship between the impedance imaginary term and the logarithmic frequency, and FIG. 16C shows the impedance plot, where white circles represent measured impedance spectrum data (that is, same as FIG. 12), and solid lines represent theoretical impedance spectrum data. According to FIG. 16, it was visually confirmed that the theoretical impedance spectrum data could completely reproduce the measured impedance spectrum data, and the obtained parameters were appropriate.

Comparative Example 3

Comparative Example 3 used the above formulas (a) and (b) to investigate the logarithmic relaxation time dependence (relaxation time distribution analysis of the conventional method) of the natural logarithmic relaxation time distribution resistor $R_k$ based on the impedance spectrum of the insulating oxide (FIG. 17) uploaded to the Google Impedance Spectroscopy forum (https://groups.google.com/forum/#!forum/impedance-spectroscopy). Moreover, the theoretical impedance spectrum data was calculated from the obtained relaxation time distribution analysis, and compared with the measured impedance spectrum data. These results are shown in FIGS. 18 and 19.

Figure 17:
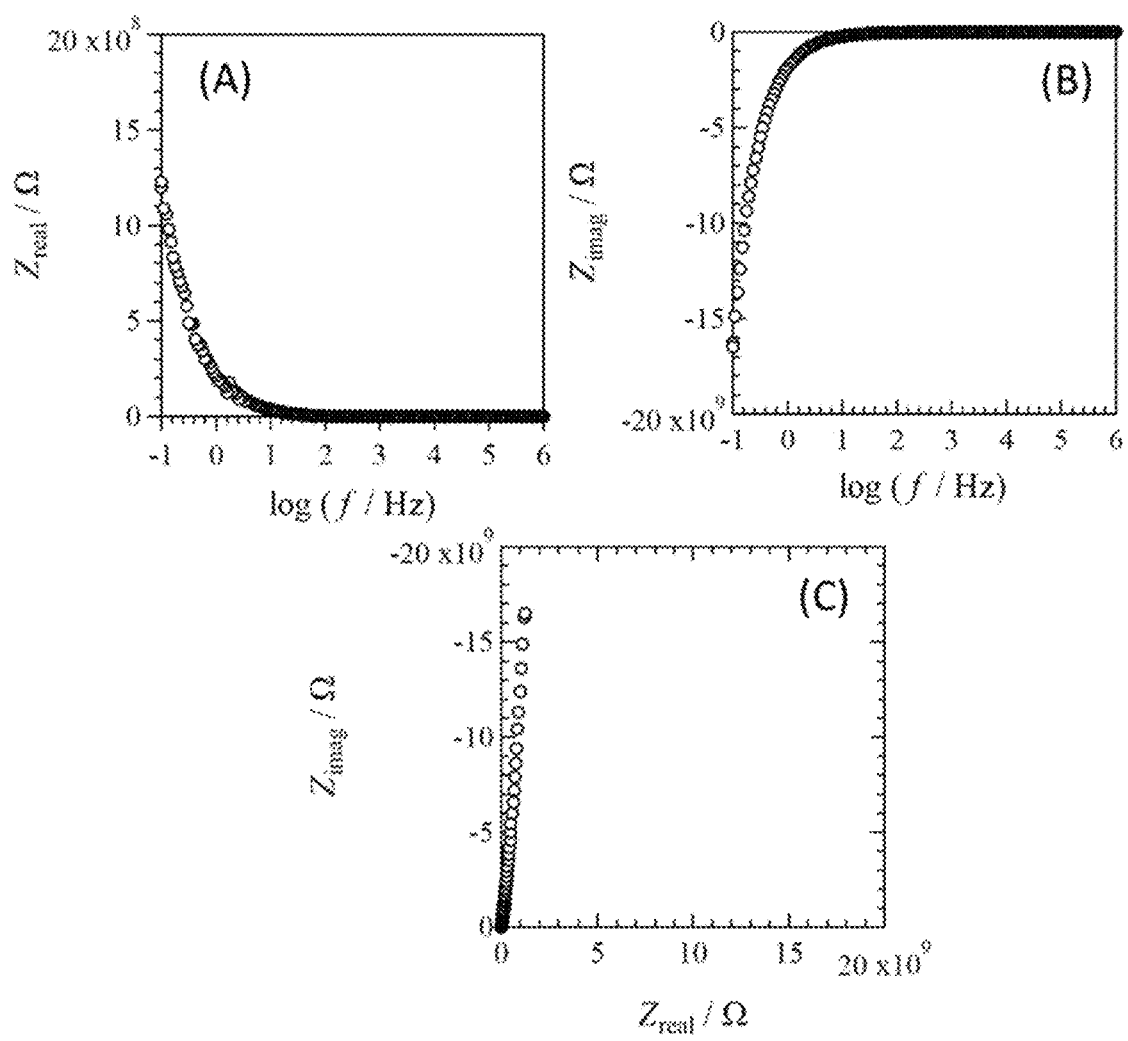
FIG. 17 is a diagram showing impedance spectrum data of an insulating oxide uploaded to the Google Impedance Spectroscopy forum of Comparative Example 3.

FIG. 17 is a diagram showing impedance spectrum data of an insulating oxide uploaded to the Google Impedance Spectroscopy forum of Comparative Example 3.

FIG. 17A shows the relationship between the impedance real term and the logarithmic frequency, FIG. 17B shows the relationship between the impedance imaginary term and the logarithmic frequency, and FIG. 17C shows the impedance plot, where even though the frequency became smaller, both the impedance real term and the impedance imaginary term became a spectrum not converging to a constant value.

Figure 18:
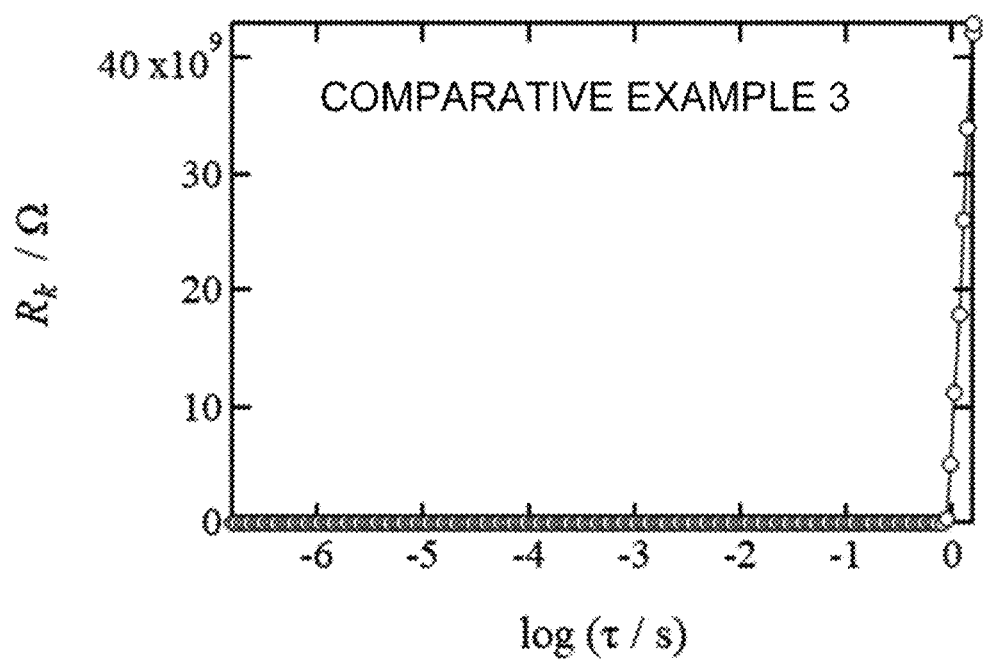
FIG. 18 is a diagram showing the logarithmic relaxation time dependence of the natural logarithmic relaxation time distribution resistor $R_k$ based on the impedance spectrum data of FIG. 17 according to Comparative Example 3.
Figure 19:
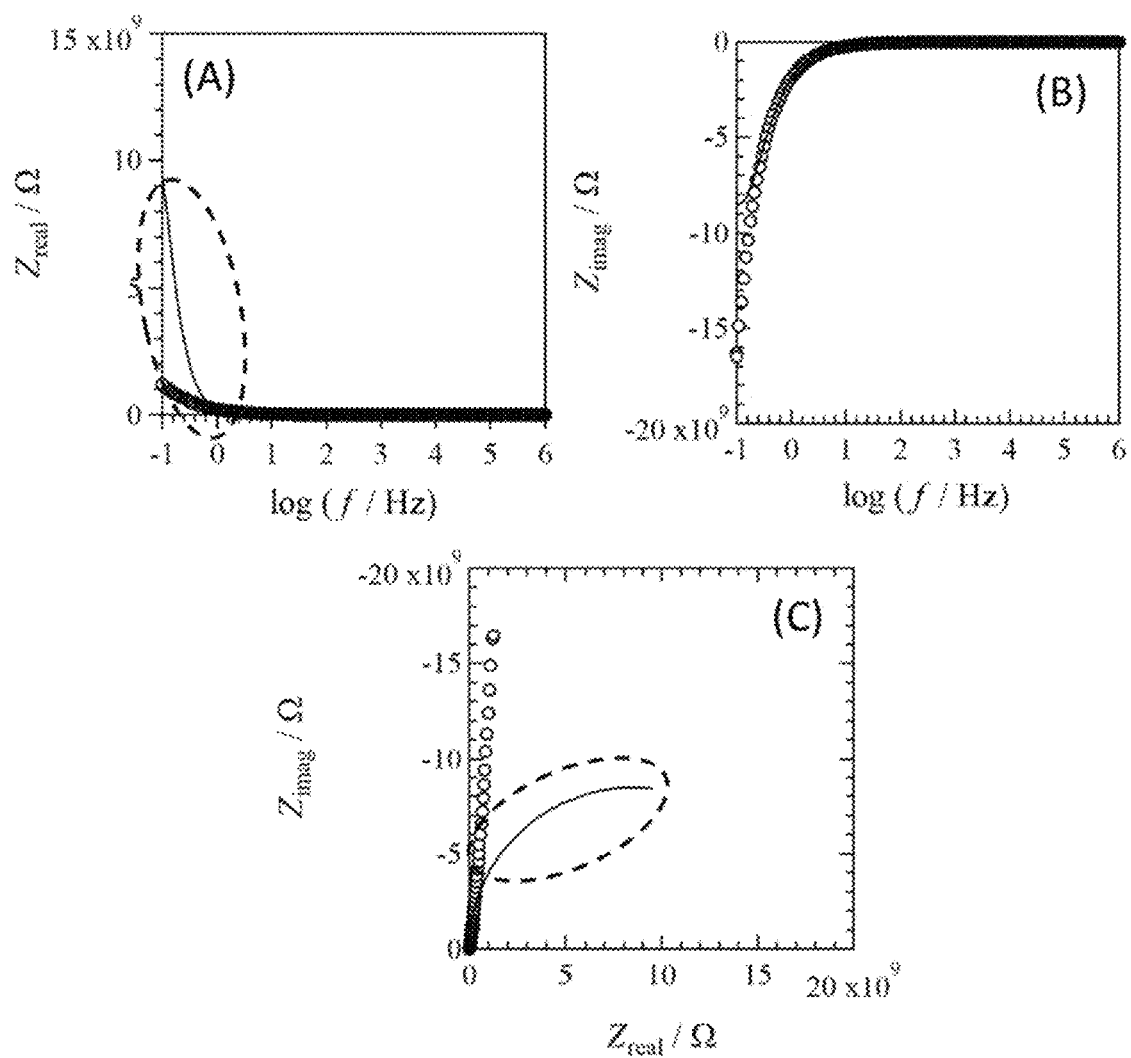
FIG. 19 is a diagram showing a comparison between the theoretical impedance spectrum data calculated from the relaxation time distribution analysis obtained in FIG. 18 according to Comparative Example 3 and the uploaded impedance spectrum data.

FIG. 18 is a diagram showing the logarithmic relaxation time dependence of the natural logarithmic relaxation time distribution resistor $R_k$ based on the impedance spectrum data of FIG. 17 according to Comparative Example 3.

According to FIG. 18, it was found that, in the relaxation time distribution analysis of the conventional method, there was no peak of $R_k$ in the range of the logarithmic relaxation time corresponding to the measured logarithmic frequency.

FIG. 19 is a diagram showing a comparison between the theoretical impedance spectrum data calculated from the relaxation time distribution analysis obtained in FIG. 18 according to Comparative Example 3 and the uploaded impedance spectrum data.

FIG. 19A shows the relationship between the impedance real term and the logarithmic frequency, FIG. 19B shows the relationship between the impedance imaginary term and the logarithmic frequency, and FIG. 19C shows the impedance plot, where white circles represent uploaded impedance spectrum data (that is, same as FIG. 17), and solid lines represent theoretical impedance spectrum data. According to FIG. 19, it was confirmed that the theoretical impedance spectrum data could not reproduce the measured impedance spectrum data, especially in the regions shown by the dotted lines.

Example 3

In Example 3, the analysis processing method shown in FIGS. 1 to 4 was carried out based on the impedance spectrum data (FIG. 17) used in Comparative Example 3. Specifically, FIG. 18 was referred to, and it was determined whether to reset the maximum value and/or the minimum value of the logarithmic relaxation time corresponding to the measured logarithmic frequency (step S110 in FIG. 1).

The maximum value and minimum value of the logarithmic relaxation time were manually reset to $\log(1/(2\pi \times 10^{-2} [s]))$ and $\log(1/(2\pi \times 10^{6} [s]))$ so that as if $R_k$ had a peak beyond the range of the logarithmic relaxation time in FIG. 18.

Figure 20:
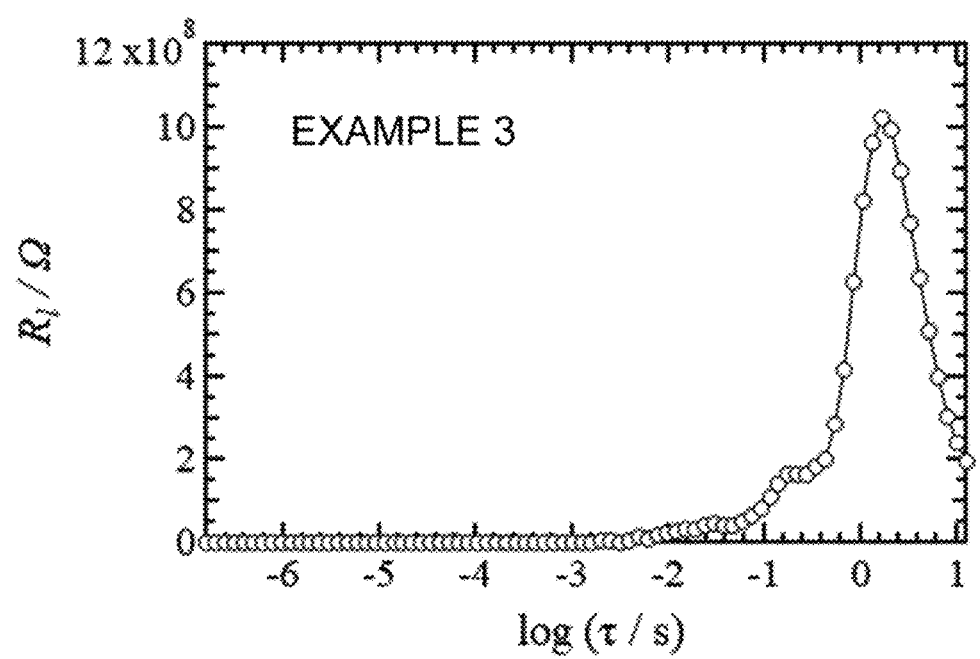
FIG. 20 is a diagram showing the logarithmic relaxation time dependence of the natural logarithmic relaxation time distribution resistor $R_l$ for which the range of the logarithmic relaxation time is reset based on the impedance spectrum data of FIG. 17 according to Example 3.

The number to be divided at equal intervals in the range of the logarithmic relaxation time set was manually set to 10 points per digit of the relaxation time on a logarithmic scale (step S130 in FIG. 1). Next, regularized least squares was applied to analyze parameters $R_\infty$, T, L, and $R_l$ with respect to the range of the logarithmic relaxation time set and the number of divisions set so as to satisfy the formula (A) (step S140 in FIG. 1). Note that the initial values of the parameters used were $R_\infty=1$, $T=10^{f_{max}'}$, $L=10^{f_{max}'+3}$ and $R_k=|Z_{imag}^{av}|/M$. Here, $|Z_{imag}^{av}|$ was the absolute value of the average value ($1.2 \times 10^{-9}$ S2) of all measured impedance imaginary values, $f_{max}'$ was $10^6$ Hz, and M was 71. This analysis was performed by a computer device using the formula (B) and Tikhonov's regularized nonlinear optimization. The results are shown in FIG. 20. Moreover, the theoretical impedance spectrum data was calculated from the relaxation time distribution analysis and compared with the uploaded impedance spectrum data. The results are shown in FIG. 21.

FIG. 20 is a diagram showing the logarithmic relaxation time dependence of the natural logarithmic relaxation time distribution resistor $R_l$ for which the range of the logarithmic relaxation time is reset based on the impedance spectrum data of FIG. 17 according to Example 3.

According to FIG. 20, in the relaxation time distribution analysis where the range of the logarithmic relaxation time was reset and the formula (A) devised by the present inventor was used, it was found that there was a peak of $R_l$ in the range of the logarithmic relaxation time set.

Figure 21:
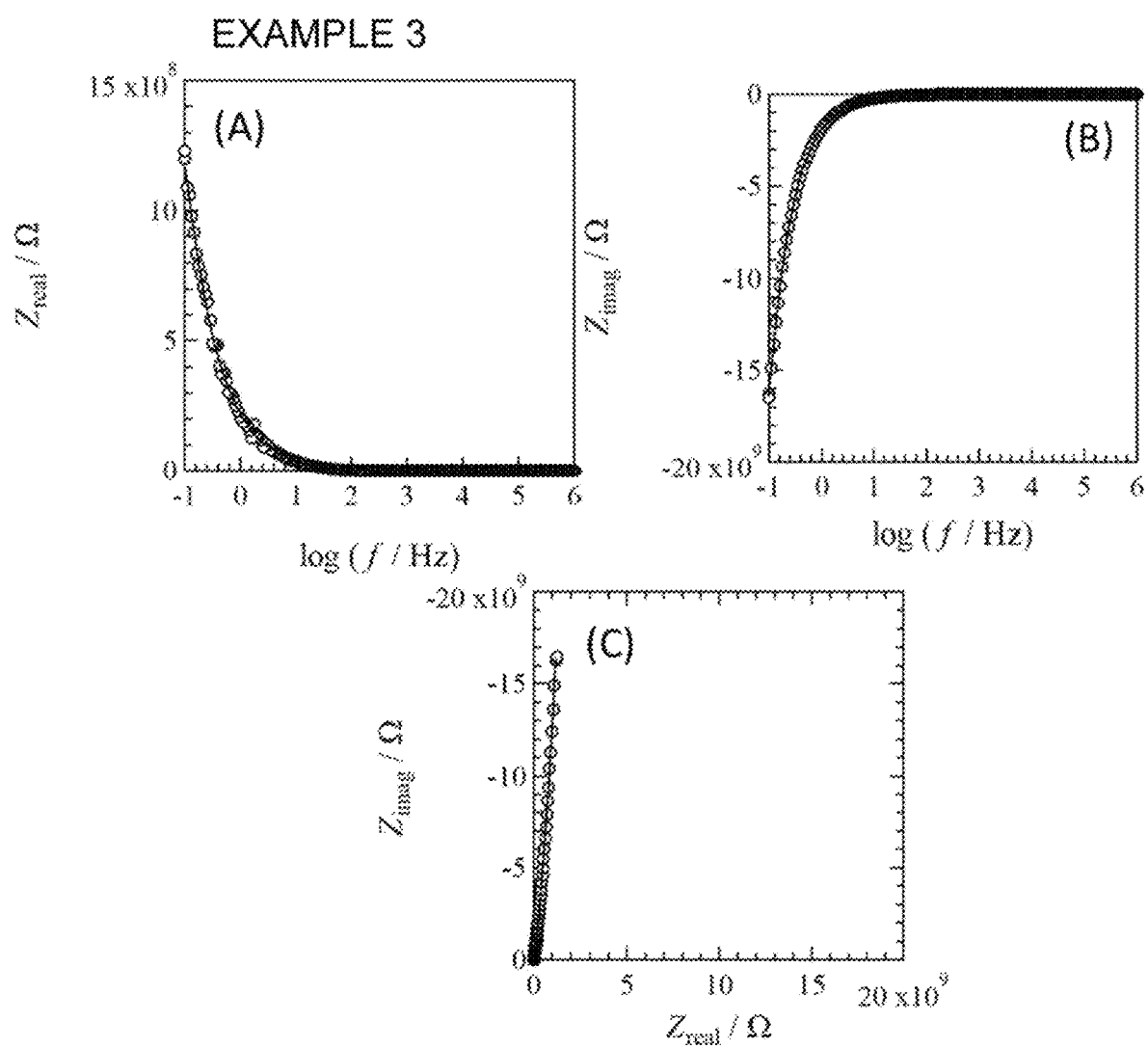
FIG. 21 is a diagram showing a comparison between the theoretical impedance spectrum data calculated from the relaxation time distribution analysis obtained in FIG. 20 according to Example 3 and the uploaded impedance spectrum data.

FIG. 21 is a diagram showing a comparison between the theoretical impedance spectrum data calculated from the relaxation time distribution analysis obtained in FIG. 20 according to Example 3 and the uploaded impedance spectrum data.

FIG. 21A shows the relationship between the impedance real term and the logarithmic frequency, FIG. 21B shows the relationship between the impedance imaginary term and the logarithmic frequency, and FIG. 21C shows the impedance plot, where white circles represent uploaded impedance spectrum data (that is, same as FIG. 17), and solid lines represent theoretical impedance spectrum data. According to FIG. 21, it was visually confirmed that the theoretical impedance spectrum data could completely reproduce the uploaded impedance spectrum data, and the obtained parameters were appropriate.

INDUSTRIAL APPLICABILITY

Employment of an impedance spectrum data analysis processing method of the present invention makes it possible to reproduce data in which the absolute impedance value does not converge to a constant value by a model, and relaxation time distribution analysis is also made possible. Employment of such an analysis processing method makes it possible to provide an impedance spectrum data analysis processing system and an analysis processing program, and to analyze impedance spectrum data for various samples such as primary batteries, secondary batteries, capacitors, and corrosive systems.

REFERENCE SIGNS LIST 500 impedance spectrum data analysis processing system
510 control device
520 display device
530 electrochemical measurement device

The invention claimed is:

1. A method of analysis processing which is performed in a system including a processor and a non-transitory memory coupled to the processor and storing software instructions executed by the processor, the method comprising:
   (i) acquiring a measured impedance spectrum data of a sample;
   (ii) determining whether to reset a maximum value and/or a minimum value of a logarithmic relaxation time corresponding to a measured logarithmic frequency based on the measured impedance spectrum data;
   (iii) resetting the maximum value and/or the minimum value of the logarithmic relaxation time when it is determined to reset in the determining;
   (iv) setting a number of divisions to be divided at equal intervals in a range of the logarithmic relaxation time corresponding to the measured logarithmic frequency when it is determined not to reset in the determining, or a range of the logarithmic relaxation time reset when it is determined to reset in the determining;
   (v) applying regularized least squares to analyze parameters $R_\infty$, T, L, and $R_l$ with respect to the range of the logarithmic relaxation time and the number of divisions set so as to satisfy the following formula (A):

$$Z(f_p) \approx R_\infty + \frac{T}{2\pi f_p j} + 2\pi f_p L + \sum_{l=1}^{M} \frac{R_l}{1 + 2\pi j \exp(\ln \tau_l) \exp(\ln f_p)} |\Delta \ln \tau| \quad (A)$$

(p is a sequence number of a measured data point, l is a sequence number of the logarithmic relaxation time, $f_p$ is a p-th frequency, j is the unit imaginary number, M is the number of divisions of the logarithmic relaxation time, T is a reciprocal of a capacitance (C), L is an inductance, $R_\infty$ is a high frequency limiting resistance, $\tau_l$ is an l-th relaxation time, $R_l$ is a resistance value at $\tau_l$, and $|\Delta \ln \tau|$ is an absolute value of an interval of a natural logarithmic relaxation time);
   (vi) substituting the analyzed parameters into the formula (A) to obtain a theoretical impedance spectrum of the sample;
   (vii) displaying the measured impedance spectrum and the theoretical impedance spectrum such that they are comparable from user's view on a display device, and
   (viii) comparing the obtained theoretical impedance spectrum and the measured impedance spectrum, and determining whether or not the spectra match,
   wherein, when it is determined that the spectra do not match, the method further comprises repeating the steps of (iii) to (viii), and wherein, when it is determined that the spectra do match, the method further comprises determining an impedance property of the sample using the theoretical impedance spectrum of the sample.

2. The method according to claim 1, wherein
the determining determines to reset the maximum value and/or the minimum value of the logarithmic relaxation time used in the analyzing when, in the measured impedance spectrum data,
   (1) in a relationship between an impedance real term and the logarithmic frequency, the impedance real term has no plateau on a low frequency side and a high frequency side of a measured logarithmic frequency range,
   (2) in a relationship between an impedance imaginary term and the logarithmic frequency, the impedance imaginary term has no peak on the low frequency side and the high frequency side in the measured logarithmic frequency range, or
   (3) there is no arc in an impedance plot, and
the resetting
   (1') resets the maximum value and/or the minimum value of the logarithmic relaxation time used in the analyzing so that, in the relationship between the impedance real term and the logarithmic frequency, the impedance real term becomes a plateau on the low frequency side and the high frequency side beyond the measured logarithmic frequency range,
   (2') resets the maximum value and/or the minimum value of the logarithmic relaxation time used in the analyzing so that, in the relationship between the impedance imaginary term and the logarithmic frequency, the impedance imaginary term has a peak on the low frequency side and the high frequency side beyond the measured logarithmic frequency range, or
   (3') resets the maximum value and/or the minimum value of the logarithmic relaxation time used in the analyzing so that there is an arc in the impedance plot.

3. The method according to claim 1, wherein
in relation to the measured logarithmic frequency range, the determining includes obtaining logarithmic relaxation time dependence of a natural logarithmic relaxation time distribution resistor $R_k$ using the following formula (a) and the following formula (b):

$$Z(f_p) \approx R_\infty + \sum_{k=1}^{N} \frac{R_k}{1 + 2\pi j \exp(\ln \tau_k) \exp(\ln f_p)} |\Delta \ln \tau| \quad (a)$$

$$\ln \tau_k = -\ln\left(\frac{f_k}{2\pi}\right) \quad (b)$$

(k is a sequence number of the logarithmic relaxation time, p is a sequence number of the measured data point, $f_k$ and $f_p$ are k-th and p-th frequencies, j is the unit imaginary number, N is the number of measurement data points, $R_\infty$ is a high frequency limiting resistance, $\tau_k$ is a k-th relaxation time, $R_k$ is a resistance value at $\tau_k$, and $|\Delta \ln \tau|$ is the absolute value of the interval of the natural logarithmic relaxation time), to thereby determine to reset the maximum value and/or the minimum value of the logarithmic relaxation time used in the analyzing when $R_k$ has no peak in the range of the logarithmic relaxation time corresponding to the measured logarithmic frequency, and
the resetting resets the maximum value and/or the minimum value of the logarithmic relaxation time used in the analyzing so that $R_k$ has a peak beyond the range of the logarithmic relaxation time corresponding to the measured logarithmic frequency.

4. The method according to claim 1, wherein in the analyzing, an impedance of the capacitor in the formula (A) is given by the following formula (B):

$$Z(f) = T/(j2\pi f) \quad (B).$$

5. The method according to claim 1, wherein the analyzing is calculated using regularized nonlinear optimization.

6. The method according to claim 5, wherein the regularized nonlinear optimization employed is regularization selected from the group consisting of Tikhonov regularization, Lasso regularization, and Elastic Net regularization.

7. The method according to claim 5, wherein the regularized nonlinear optimization employed is nonlinear optimization selected from the group consisting of a Levenberg-Marquardt method, a simplex method, and a conjugate gradient method.

8. The method according to claim 1, the measured impedance spectrum data is impedance spectrum data of a sample selected from the group consisting of primary batteries, secondary batteries, fuel cells, capacitor materials, anticorrosion-treated metals, and ceramic materials.

9. An impedance spectrum data analysis processing system, comprising:
   a control device including a processor and a memory; and
   a display device,
   wherein the processor is configured to:
   (i) acquire a measured impedance spectrum data of a sample,
   (ii) determine whether to reset a maximum value and/or a minimum value of a logarithmic relaxation time corresponding to a measured logarithmic frequency based on the measured impedance spectrum data,
   (iii) reset the maximum value and/or the minimum value of the logarithmic relaxation time corresponding to the measured logarithmic frequency when the processor determines to reset,
   (iv) set a number of divisions to be divided at equal intervals in a range of the logarithmic relaxation time corresponding to the measured logarithmic frequency when the processor determines not to reset, or a range of the logarithm relaxation time reset by the processor when the processor determines to reset,
   (v) apply regularized least squares to analyze parameters $R_\infty$, T, L, and $R_l$ of the sample with respect to the range of the logarithmic relaxation time and the number of divisions set so as to satisfy the following formula (A):

$$Z(f_p) \approx R_\infty + \frac{T}{2\pi f_p j} + 2\pi f_p L + \sum_{l=1}^{M} \frac{R_l}{1 + 2\pi j \exp(\ln \tau_l) \exp(\ln f_p)} |\Delta \ln \tau| \quad (A)$$

(p is a sequence number of a measured data point, l is a sequence number of the logarithmic relaxation time, $f_p$ is a p-th frequency, j is the unit imaginary number, M is the number of divisions of the logarithmic relaxation time, T is a reciprocal of a capacitance (C), L is an inductance, $R_\infty$ is a high frequency limiting resistance, $\tau_l$ is an l-th relaxation time, $R_l$ is a resistance value at $\tau_l$, and $|\Delta \ln \tau|$ is an absolute value of an interval of a natural logarithmic relaxation time), (vi) substitute the analyzed parameters into the formula (A) to obtain a theoretical impedance spectrum of the sample,
   (vii) control the display device to display the measured impedance spectrum and the theoretical impedance spectrum such that they are comparable from user's view in the control device, and
   (viii) compare the obtained theoretical impedance spectrum and the measured impedance spectrum, and determine whether or not the spectra match,
   wherein, when it is determined that the spectra do not match, the processor is further configured to repeat the steps of (iii) to (viii), and
   wherein, when it is determined that the spectra do match, the processor is further configured to determine an impedance property of the sample using the theoretical impedance spectrum of the sample.

10. The analysis processing system according to claim 9, wherein
   the processor is configured to determine to reset the maximum value and/or the minimum value of the logarithmic relaxation time used in the processor when, in the measured impedance spectrum data,
   (1) in a relationship between an impedance real term and the logarithmic frequency, the impedance real term has no plateau on a low frequency side and a high frequency side of a measured logarithmic frequency range,
   (2) in a relationship between an impedance imaginary term and the logarithmic frequency, the impedance imaginary term has no peak on the low frequency side and the high frequency side in the measured logarithmic frequency range, or
   (3) there is no arc in an impedance plot, and
   the processor is configured to:
   (1') reset the maximum value and/or the minimum value of the logarithmic relaxation time used in the processor so that, in the relationship between the impedance real term and the logarithmic frequency, the impedance real term becomes a plateau on the low frequency side and the high frequency side beyond the measured logarithmic frequency range,
   (2') reset the maximum value and/or the minimum value of the logarithmic relaxation time used in the processor so that, in the relationship between the impedance imaginary term and the logarithmic frequency, the impedance imaginary term has a peak on the low frequency side and the high frequency side beyond the measured logarithmic frequency range, or
   (3') reset the maximum value and/or the minimum value of the logarithmic relaxation time used in the processor so that there is an arc in the impedance plot.

11. The analysis processing system according to claim 9, wherein
   in relation to the measured logarithmic frequency range, the processor is configured to obtain logarithmic relaxation time dependence of a natural logarithmic relaxation time distribution resistor $R_k$ using the following formula (a) and the following formula (b):

$$Z(f_p) \approx R_\infty + \sum_{k=1}^{N} \frac{R_k}{1 + 2\pi j \exp(\ln \tau_k) \exp(\ln f_p)} |\Delta \ln \tau| \quad (a)$$

$$\ln \tau_k = -\ln\left(\frac{f_k}{2\pi}\right) \quad (b)$$

(k is a sequence number of the logarithmic relaxation time, p is a sequence number of the measured data point, $f_k$ and $f_p$ are k-th and p-th frequencies, j is the unit imaginary number, N is the number of measurement data points, $R_\infty$ is a high frequency limiting resistance, $\tau_k$ is a k-th relaxation time, $R_k$ is a resistance value at $\tau_k$, and $|\Delta \ln\tau|$ is the absolute value of the interval of the natural logarithmic relaxation time), to thereby determine to reset the maximum value and/or the minimum value of the logarithmic relaxation time used in the processor when $R_k$ has no peak in the range of the measured logarithmic frequency, and the processor is configured to reset the maximum value and/or the minimum value of the logarithmic relaxation time used in the processor so that $R_k$ has a peak beyond the range of the logarithmic relaxation time corresponding to the measured logarithmic frequency.

12. The analysis processing system according to claim 10, wherein the control device includes an input terminal with which an operator visually determines the (1) to (3) from the measured impedance spectrum data displayed on the display device, and manually resets the (1') to (3').

13. The analysis processing system according to claim 11, wherein the control device includes an input terminal with which an operator visually determines whether or not the natural logarithmic relaxation time distribution resistor $R_k$ has a peak in the measured logarithmic frequency range from the logarithmic relaxation time dependence of $R_k$ displayed on the display device, and manually resets the maximum value and/or the minimum value of the logarithmic relaxation time used in the processor so that $R_k$ has a peak beyond the measured logarithmic frequency range.

14. The analysis processing system according to claim 9, wherein in the formula (A), an impedance of the capacitor is given by the following formula (B):

$$Z(f)=T/(j2\pi f) \quad \text{(B)}.$$

15. A non-transitory computer-readable recording medium storing an impedance spectrum data analysis processing program that causes a computer to execute a process, the process comprising:

(i) acquiring a measured impedance spectrum data of a sample;
(ii) determining whether to reset a maximum value and/or a minimum value of a logarithmic relaxation time corresponding to a measured logarithmic frequency based on the measured impedance spectrum data;
(iii) resetting the maximum value and/or the minimum value of the logarithmic relaxation time when it is determined to reset in the determining;
(iv) setting a number to be divided at equal intervals in a range of the logarithmic relaxation time corresponding to the measured logarithmic frequency when it is determined not to reset in the determining, or a range of the logarithmic relaxation time reset when it is determined to reset in the determining;
(v) applying regularized least squares to analyze parameters $R_\infty$, T, L, and $R_l$ of the sample with respect to the range of the logarithmic relaxation time and the number of divisions set so as to satisfy the following formula (A):

$$Z(f_p) \approx R_\infty + \frac{T}{2\pi f_p j} + 2\pi f_p L + \sum_{l=1}^{M} \frac{R_l}{1+2\pi j\exp(\ln\tau_l)\exp(\ln f_p)}|\Delta\ln\tau| \quad \text{(A)}$$

(p is a sequence number of a measured data point, l is a sequence number of the logarithmic relaxation time, $f_p$ is a p-th frequency, j is the unit imaginary number, M is the number of divisions of the logarithmic relaxation time, T is a reciprocal of a capacitance (C), L is an inductance, $R_\infty$ is a high frequency limiting resistance, $\tau_l$ is an l-th relaxation time, $R_l$ is a resistance value at $\tau_l$, and $|\Delta \ln\tau|$ is an absolute value of an interval of a natural logarithmic relaxation time);

(vi) substituting the analyzed parameters into the formula (A) to obtain a theoretical impedance spectrum of the sample;
(vii) displaying the measured impedance spectrum and the theoretical impedance spectrum such that they are comparable from user's view on a display device, and
(viii) comparing the obtained theoretical impedance spectrum and the measured impedance spectrum, and determining whether or not the spectra match, wherein, when it is determined that the spectra do not match, the process further comprises repeating the steps of (iii) to (viii), and wherein, when it is determined that the spectra do match, the process further comprises determining an impedance property of the sample using the theoretical impedance spectrum of the sample.

16. The non-transitory computer-readable recording medium according to claim 15, wherein the determining determines to reset the maximum value and/or the minimum value of the logarithmic relaxation time used in the analyzing when, in the measured impedance spectrum data, (1) in a relationship between an impedance real term and the logarithmic frequency, the impedance real term has no plateau on a low frequency side and a high frequency side of a measured logarithmic frequency range,
(2) in a relationship between an impedance imaginary term and the logarithmic frequency, the impedance imaginary term has no peak on the low frequency side and the high frequency side in the measured logarithmic frequency range, or
(3) there is no arc in an impedance plot, and the resetting
(1') resets the maximum value and/or the minimum value of the logarithmic relaxation time used in the analyzing so that, in the relationship between the impedance real term and the logarithmic frequency, the impedance real term becomes a plateau on the low frequency side and the high frequency side beyond the measured logarithmic frequency range,
(2') resets the maximum value and/or the minimum value of the logarithmic relaxation time used in the analyzing so that, in the relationship between the impedance imaginary term and the logarithmic frequency, the impedance imaginary term has a peak on the low frequency side and the high frequency side beyond the measured logarithmic frequency range, or
(3') resets the maximum value and/or the minimum value of the logarithmic relaxation time used in the analyzing so that there is an arc in the impedance plot.

17. The non-transitory computer-readable recording medium according to claim 15, wherein in relation to the measured logarithmic frequency range, the determining includes obtaining logarithmic relaxation time dependence of a natural logarithmic relaxation time distribution resistor $R_k$ using the following formula (a) and the following formula (b):

$$Z(f_p) \approx R_\infty + \sum_{k=1}^{N} \frac{R_k}{1+2\pi j\exp(\ln\tau_k)\exp(\ln f_p)}|\Delta\ln\tau| \quad \text{(a)}$$

-continued $$\ln\tau_k = -\ln\left(\frac{f_k}{2\pi}\right) \qquad (b)$$

(k is a sequence number of the logarithmic relaxation time, p is a sequence number of the measured data point, $f_k$ and $f_p$ are k-th and p-th frequencies, j is the unit imaginary number, N is the number of measurement data points, $R_\infty$ is a high frequency limiting resistance, $\tau_k$ is a k-th relaxation time, $R_k$ is a resistance value at $\tau_k$, and $|\Delta \ln\tau|$ is the absolute value of the interval of the natural logarithmic relaxation time), to thereby determine to reset the maximum value and/or the minimum value of the logarithmic relaxation time used in the analyzing when $R_k$ has no peak in the range of the measured logarithmic frequency, and the resetting resets the maximum value and/or the minimum value of the logarithmic relaxation time used in the analyzing so that $R_k$ has a peak beyond the range of the logarithmic relaxation time corresponding to the measured logarithmic frequency.

\* \* \* \* \*